United States Patent
Kim et al.

(10) Patent No.: US 11,329,057 B2
(45) Date of Patent: May 10, 2022

(54) INTEGRATED CIRCUIT DEVICE

(71) Applicant: Samsung Electronics Co., Ltd., Suwon-si (KR)

(72) Inventors: Chanho Kim, Seoul (KR); Dongku Kang, Seongnam-si (KR); Daeseok Byeon, Seongnam-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days.

(21) Appl. No.: 16/944,733

(22) Filed: Jul. 31, 2020

(65) Prior Publication Data

US 2021/0066320 A1      Mar. 4, 2021

Related U.S. Application Data

(63) Continuation-in-part of application No. 16/806,030, filed on Mar. 2, 2020, now Pat. No. 11,114,428.

(30) Foreign Application Priority Data

Aug. 30, 2019   (KR) .................. 10-2019-0107645

(51) Int. Cl.
```
H01L 23/48        (2006.01)
H01L 23/52        (2006.01)
H01L 29/40        (2006.01)
H01L 27/112       (2006.01)
H01L 27/11585     (2017.01)
```
(Continued)

(52) U.S. Cl.
CPC .. H01L 27/11286 (2013.01); H01L 27/10808 (2013.01); H01L 27/11585 (2013.01); H01L 27/2481 (2013.01)

(58) Field of Classification Search
CPC combination set(s) only.
See application file for complete search history.

(56) References Cited

U.S. PATENT DOCUMENTS

| | | |
|---|---|---|
| 8,860,229 B1 | 10/2014 | Lin |
| 9,293,392 B2 | 3/2016 | Chou et al. |
| 9,558,945 B2 * | 1/2017 | Fukuzumi ......... H01L 27/11582 |

(Continued)

OTHER PUBLICATIONS

Notice of Allowance dated Apr. 28, 2021, for corresponding U.S. Appl. No. 16/806,030.

*Primary Examiner* — Niki H Nguyen
(74) *Attorney, Agent, or Firm* — Harness, Dickey & Pierce, P.L.C.

(57) ABSTRACT

An integrated circuit device includes a memory including a memory cell insulation surrounding a memory stack and a memory cell interconnection unit, a peripheral circuit including a peripheral circuit region formed on a peripheral circuit board, and a peripheral circuit interconnection between the peripheral circuit region and the memory structure, a plurality of conductive bonding structures on a boundary between the memory cell interconnection and the peripheral circuit interconnection in a first region, the first region overlapping the memory stack in a vertical direction, and a through electrode penetrating one of the memory cell insulation and the peripheral circuit board and extended to a lower conductive pattern included in the peripheral circuit interconnection in a second region, the second region overlapping the memory cell insulation in the vertical direction.

20 Claims, 29 Drawing Sheets

(51) Int. Cl.
*H01L 27/108* (2006.01)
*H01L 27/24* (2006.01)

(56) References Cited

U.S. PATENT DOCUMENTS

| | | | | |
|---|---|---|---|---|
| 9,876,031 | B1* | 1/2018 | Shimizu | H01L 29/42344 |
| 10,074,667 | B1* | 9/2018 | Higashi | H01L 27/11553 |
| 10,147,732 | B1 | 12/2018 | Hu et al. | |
| 10,283,452 | B2 | 5/2019 | Zhu et al. | |
| 2019/0221557 | A1* | 7/2019 | Kim | H01L 27/11582 |
| 2020/0402579 | A1* | 12/2020 | Park | G11C 16/26 |

* cited by examiner

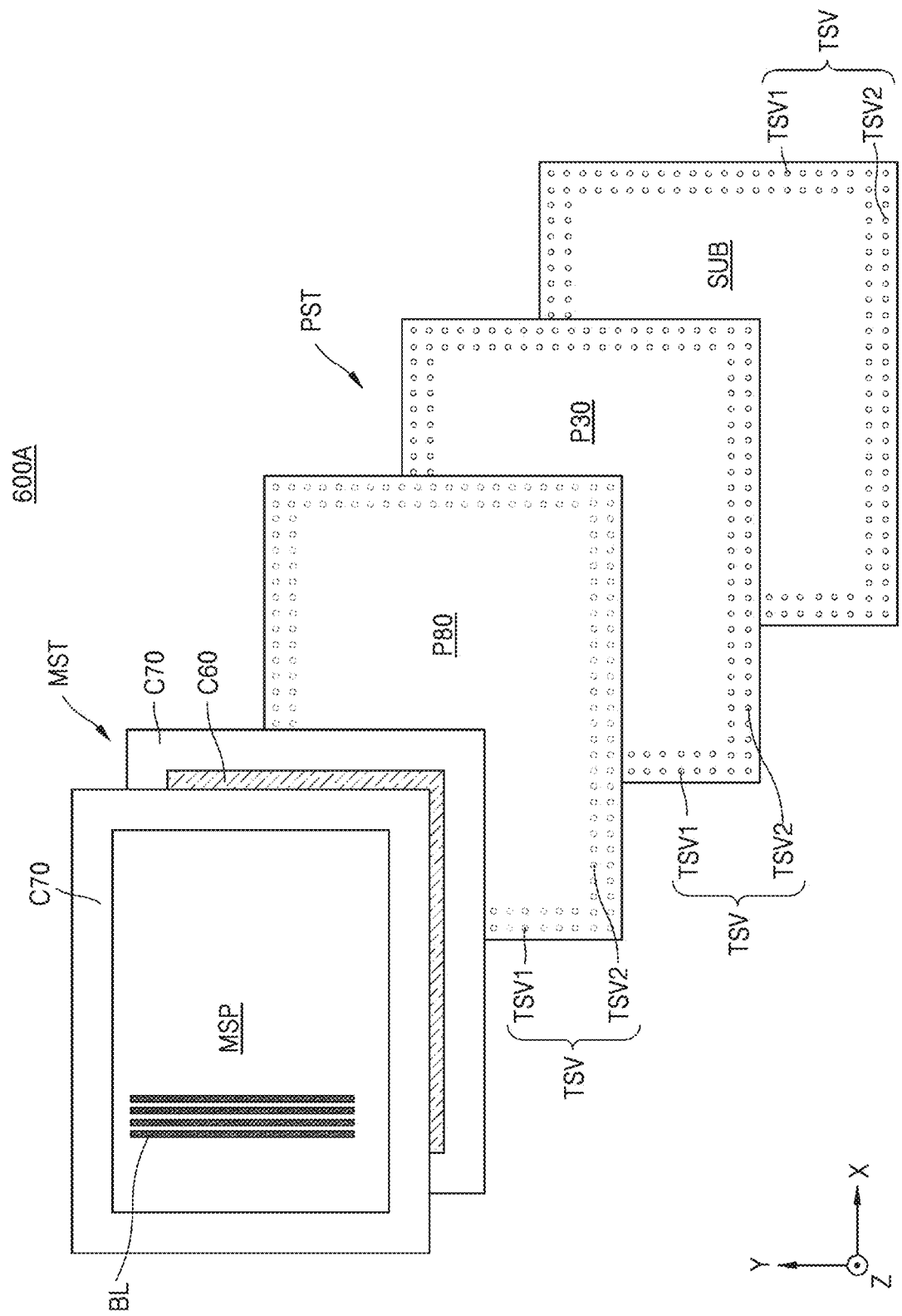

the memory and bonded to the memory cell interconnection unit; a conductive bonding on a boundary between the memory cell interconnection and the peripheral circuit interconnection in a first region, the first region overlapping the memory stack in a vertical direction, the conductive bonding being bonded first upper conductive pattern selected from among the plurality of upper conductive patterns and a first lower conductive pattern selected from among the plurality of lower conductive patterns; and a plurality of through electrodes extended in the vertical direction through one of the memory cell insulation and the peripheral circuit board, in a second region spaced apart from the first region in a horizontal direction, wherein the plurality of through electrodes include a plurality of first through electrodes arranged in a line along the first horizontal direction in the second region.

INTEGRATED CIRCUIT DEVICE

CROSS-REFERENCE TO RELATED APPLICATION

This application is a continuation in part of U.S. application Ser. No. 16/806,030, filed Mar. 2, 2020, which claims priority under claims the benefit of Korean Patent Application No. 10-2019-0107645, filed on Aug. 30, 2019, in the Korean Intellectual Property Office, the entire contents of each of which are incorporated herein by reference.

BACKGROUND

The inventive concepts relate to integrated circuit devices, and more particularly, to integrated circuit devices including a nonvolatile memory device having a cell over periphery (COP) structure.

In accordance with the multifunctionalization of information communication apparatuses, integrated circuit devices including memory devices have become mass storage and highly integrated, and thus sizes of memory cells have gradually reduced and operation circuits and interconnection structures included in the memory devices for the operation and electrical connection of the memory devices are becoming more complicated. Accordingly, there is a need for an integrated circuit device including a memory device having a structure with excellent electrical characteristics while improving the degree of integration.

SUMMARY

The inventive concepts provide an integrated circuit device having a structure capable of improving the reliability of an interconnection structure with improved integration and reduced chip size.

According to some aspects of the inventive concepts, there is provided an integrated circuit device including: a memory including a memory stack unit, a memory cell interconnection including a plurality of upper conductive patterns configured to be electrically connectable to the memory stack unit, and a memory cell insulation surrounding the memory stack and the memory cell interconnection unit; a peripheral circuit including a peripheral circuit board, a peripheral circuit region on the peripheral circuit board, and a peripheral circuit interconnection including a plurality of lower conductive patterns between the peripheral circuit region and the memory and bonded to the memory cell interconnection unit; a plurality of conductive bonding structures on a boundary between the memory cell interconnection and the peripheral circuit interconnection in a first region, the first region overlapping the memory stack in a vertical direction, the plurality of conductive bonding structures being bonded plurality of first upper conductive patterns selected from among the plurality of upper conductive patterns and a respective plurality of first lower conductive patterns selected from among the plurality of lower conductive patterns; and a through electrode penetrating one of the memory cell insulation and the peripheral circuit board and extended to a second lower conductive pattern selected from among the plurality of lower conductive patterns in the vertical direction, in a second region, the second region overlapping the memory cell insulation in the vertical direction.

According to an aspect of the inventive concept, there is provided an integrated circuit device including: a memory including a memory stack including a plurality of bit lines extending in a first horizontal direction, a memory cell interconnection including a plurality of upper conductive patterns configured to be electrically connectable to the plurality of bit lines, and a memory cell insulation surrounding the memory stack and the memory cell interconnection unit; a peripheral circuit including a peripheral circuit board, a peripheral circuit region on the peripheral circuit board, and a peripheral circuit interconnection including a plurality of lower conductive patterns between the peripheral circuit region and the memory and bonded to the memory cell interconnection unit; a conductive bonding on a boundary between the memory cell interconnection and the peripheral circuit interconnection in a first region, the first region overlapping the memory stack in a vertical direction, the conductive bonding being bonded first upper conductive pattern selected from among the plurality of upper conductive patterns and a first lower conductive pattern selected from among the plurality of lower conductive patterns; and a plurality of through electrodes extended in the vertical direction through one of the memory cell insulation and the peripheral circuit board, in a second region spaced apart from the first region in a horizontal direction, wherein the plurality of through electrodes include a plurality of first through electrodes arranged in a line along the first horizontal direction in the second region.

According to an aspect of the inventive concept, there is provided an integrated circuit device including: a memory including a semiconductor layer, a memory stack on the semiconductor layer, a memory cell interconnection including a plurality of upper conductive patterns overlapping the memory stack in a vertical direction and configured to be electrically connectable to the memory stack unit, and a memory cell insulation surrounding the semiconductor layer, the memory stack and the memory cell interconnection unit; a peripheral circuit including a peripheral circuit board, a peripheral circuit region on the peripheral circuit board, and a peripheral circuit interconnection between the peripheral circuit region and the memory and bonded to the memory cell interconnection unit; a plurality of conductive bonding structures including Cu and on a boundary between the memory cell interconnection and the peripheral circuit interconnection in a first region, the first region overlapping the memory stack in the vertical direction; a plurality of lower conductive patterns including at least one metal selected from among Al, W, and Cu and in the peripheral circuit interconnection in a second region, the second region overlapping the memory cell insulation in the vertical direction; and a through electrode penetrating one of the memory cell insulation and the peripheral circuit board in the second region and contacting one lower conductive pattern among the plurality of lower conductive patterns.

BRIEF DESCRIPTION OF THE DRAWINGS

Embodiments of the inventive concepts will be more clearly understood from the following detailed description taken in conjunction with the accompanying drawings in which:

FIGS. 14A and 14B are exploded plan views respectively illustrating some components of an integrated circuit device according to example embodiments of the inventive concepts;

DETAILED DESCRIPTION OF THE EMBODIMENTS

Figure 1:
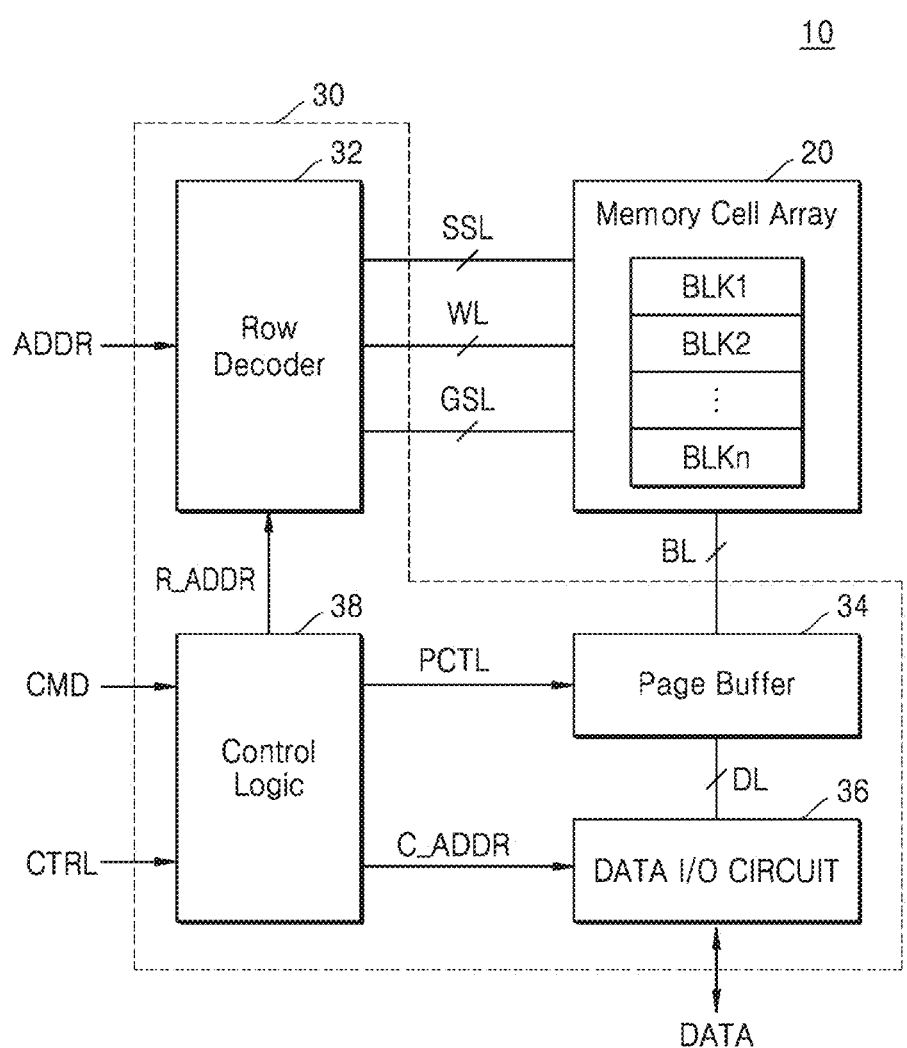
FIG. 1 is a block diagram of an integrated circuit device according to example embodiments of the inventive concepts.

Hereinafter, example embodiments of the inventive concepts will be described in detail with reference to the accompanying drawings. The same reference numerals are used for the same elements in the drawings, and redundant description thereof will be omitted.

FIG. 1 is a block diagram of an integrated circuit device 10 according to example embodiments of the inventive concepts.

Referring to FIG. 1, the integrated circuit device 10 may include a memory cell array 20 and a peripheral circuit 30. The memory cell array 20 may include a plurality of memory cell blocks BLK1, BLK2, . . . , and BLKn. Each of the plurality of memory cell blocks BLK1, BLK2, . . . , and BLKn may include a plurality of memory cells. The memory cell blocks BLK1, BLK2, . . . , and BLKn may be connected to the peripheral circuit 30 through a bit line BL, a word line WL, a string select line SSL, and a ground select line GSL.

The peripheral circuit 30 may include a row decoder 32, a page buffer 34, a data input/output circuit 36, and a control logic 38. Although not shown in FIG. 1, the peripheral circuit 30 may further include an input/output interface, a column logic, a voltage generator, a pre-decoder, a temperature sensor, a command decoder, an address decoder, and the like.

The peripheral circuit 30 (as well as other elements and/or sub-elements, such as the row decoder 32, page buffer 34, data input/output circuit 36, and control logic 38) may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The memory cell array 20 may be connected to the page buffer 34 through the bit line BL and may be connected to the row decoder 32 through the word line WL, the string select line SSL, and the ground select line GSL. In the memory cell array 20, the plurality of memory cells included in the plurality of memory cell blocks BLK1, BLK2, . . . , and BLKn may be flash memory cells, respectively. The memory cell array 20 may include a three dimensional memory cell array. The three dimensional memory cell array may include a plurality of NAND strings, and each of the NAND strings may include memory cells respectively connected to a plurality of word lines WL vertically stacked on a substrate. In example embodiments, the memory cell array 20 may include a memory stack MS described below with reference to FIGS. 4A and 4B.

The peripheral circuit 30 may receive an address ADDR, a command CMD, and a control signal CTRL from the outside of the integrated circuit device 10, and may transmit and receive data DATA to and from an apparatus outside the integrated circuit device 10.

The row decoder 32 may select at least one of the plurality of memory cell blocks BLK1, BLK2, . . . , and BLKn in response to an address ADDR from the outside and may select the word line WL, the string select line SSL, and the ground select line GSL of the selected memory cell block. The row decoder 32 may transmit a voltage for performing a memory operation to the word line WL of the selected memory cell block.

The page buffer 34 may be connected to the memory cell array 20 through the bit line BL. The page buffer 34 may operate as a write driver in a program operation and thus apply a voltage corresponding to the data DATA to be stored in the memory cell array 20 to the bit line BL and may operate as a sense amplifier in a read operation and thus sense the data DATA stored in the memory cell array 20. The page buffer 34 may operate according to a control signal PCTL to be provided from the control logic 38.

The data input/output circuit 36 may be connected to the page buffer 34 through data lines DLs. The data input/output circuit 36 may receive the data DATA from a memory controller (not shown) in the program operation and may provide program data DATA to the page buffer 34 based on a column address C_ADDR to be provided from the control logic 38. The data input/output circuit 36 may provide read data DATA stored in the page buffer 34 to the memory controller, based on the column address C_ADDR to be provided from the control logic 38 in the read operation.

The data input/output circuit 36 may transmit an input address or command to the control logic 38 or the row decoder 32. The peripheral circuit 30 of the integrated circuit device 10 may further include an electrostatic discharge (ESD) circuit and a pull-up/pull-down driver.

The control logic 38 may receive the command CMD and the control signal CTRL from the memory controller. The control logic 38 may provide a row address R_ADDR to the row decoder 32 and may provide the column address C_ADDR to the data input/output circuit 36. The control logic 38 may generate various internal control signals to be used in the integrated circuit device 10 in response to the control signal CTRL. For example, the control logic 38 may adjust voltage levels to be provided to the word line WL and the bit line BL when performing a memory operation such as a program operation or an erase operation.

Figure 2:
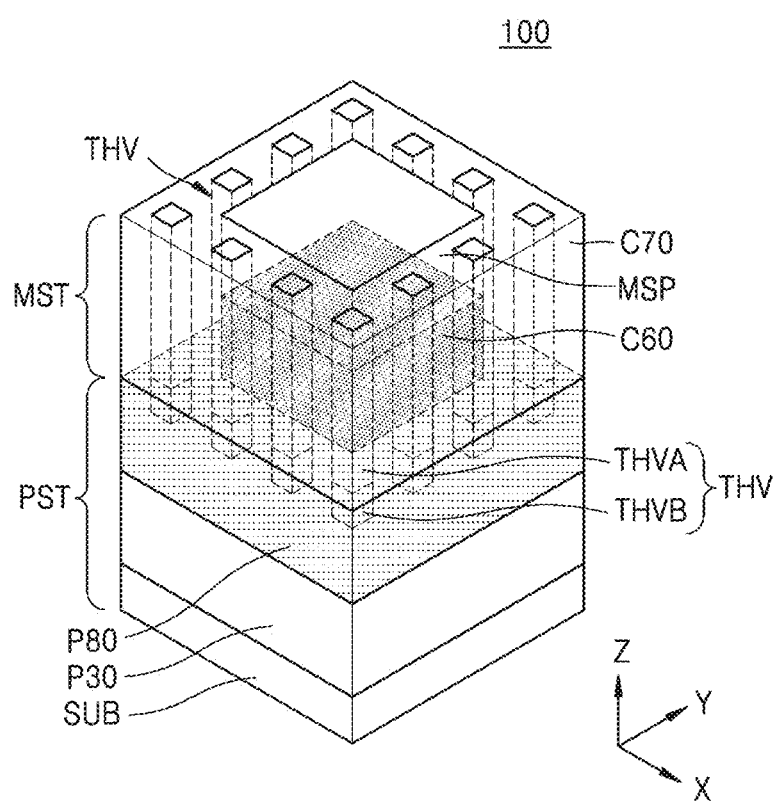
FIG. 2 is a perspective view illustrating a schematic structure of an integrated circuit device according to example embodiments of the inventive concepts.

FIG. 2 is a perspective view illustrating a schematic structure of an integrated circuit device 100 according to example embodiments of the inventive concepts. The integrated circuit device 100 may be a specific implementation of some of the example embodiments of the integrated circuit device 10 illustrated in FIG. 1.

Referring to FIG. 2, the integrated circuit device 100 may include a memory structure MST and a peripheral circuit structure PST overlapping each other in a vertical direction (a Z direction).

The memory structure MST may include a memory stack unit MSP including a memory cell array 20 (see FIG. 1), a memory cell interconnection unit C60 configured to be electrically connected to the memory stack unit MSP, and a memory cell insulation unit C70 surrounding the memory stack unit MSP and the memory cell interconnection unit C60. The memory cell insulation unit C70 may be disposed to surround at least two sides of the memory stack unit MSP at a position vertically overlapping with the peripheral circuit structure PST. FIG. 2 illustrates that the memory cell insulation unit C70 may have a ring shape surrounding four sides of the memory stack unit MSP such that the memory cell insulation unit C70 covers both sides in an X direction and both sides in a Y direction of the memory stack unit MSP, but the inventive concepts are not limited to the illustration in FIG. 2. The memory cell insulation unit C70 may be arranged to surround at least one of both sides of the X direction and at least one of both sides of the Y direction of the memory stack unit MSP.

The peripheral circuit structure PST may include a peripheral circuit board SUB, a peripheral circuit region P30 and a peripheral circuit interconnection part P80 sequentially formed on the peripheral circuit board SUB. The peripheral circuit region P30 may include the peripheral circuit 30 described with reference to FIG. 1. The peripheral circuit interconnection unit P80 may be configured to be electrically connected to the peripheral circuit 30 included in the peripheral circuit board SUB and the peripheral circuit region P30. The peripheral circuit region P30 may be spaced apart from the memory stack unit MSP in the vertical direction (the Z direction) with the memory cell interconnection unit C60 and the peripheral circuit interconnection unit P80 therebetween.

The integrated circuit device 100 may have a cell over periphery (COP) structure in which the memory structure MST may be disposed on the peripheral circuit structure PST, thereby reducing a horizontal area of the integrated circuit device 100 and improving the degree of integration.

Each of the memory cell interconnection unit C60 and the peripheral circuit interconnection unit P80 may include a plurality of conductive patterns and a plurality of contact plugs for interconnecting two conductive patterns adjacent in the vertical direction among the plurality of conductive patterns (not illustrated). The memory cell interconnection unit C60 and the peripheral circuit interconnection unit P80 may be in contact with each other by bonding. The plurality of conductive patterns of each of the memory cell interconnection unit C60 and the peripheral circuit interconnection unit P80 may include a plurality of conductive bonding patterns for mutually bonding the memory cell interconnection unit C60 and the peripheral circuit interconnection unit P80 (not illustrated). A plurality of conductive bonding structures, which are a result obtained by bonding the conductive bonding pattern included in the memory cell interconnection unit C60 and the conductive bonding pattern included in the peripheral circuit interconnection unit P80, may be arranged along a boundary between the memory cell interconnection unit C60 and the peripheral circuit interconnection unit P80. The conductive bonding structure may not be disposed at a boundary between the memory cell insulation unit C70 and the peripheral circuit interconnection unit P80.

The integrated circuit device 100 may include a plurality of through electrodes THV penetrating the memory cell insulation unit C70 in the vertical direction. Each of the plurality of through electrodes THV may include a first portion THVA penetrating the memory cell insulation unit C70 and a second portion THVB penetrating a portion of the peripheral circuit interconnection unit P80. Each of the plurality of through electrodes THV may be connected to at least one conductive pattern selected from among a plurality of conductive patterns included in the peripheral circuit interconnection unit P80 and may be connected to the peripheral circuit 30 (see FIG. 1) in the peripheral circuit region P30 through the at least one conductive pattern.

There may not be a conductive bonding structure, which is a result obtained by bonding the conductive bonding pattern included in the memory cell interconnection unit C60 to the conductive bonding pattern included in the peripheral circuit interconnection unit P80, in an electrical connection path between the plurality of through electrodes THV and the peripheral circuit 30 (see FIG. 1) in the peripheral circuit region P30. Therefore, it may be possible to prevent or reduce the increase in resistance due to the conductive bonding structure in the electrical connection path between the plurality of through electrodes THV and the peripheral circuit 30 (see FIG. 1) in the peripheral circuit region P30.

Figure 3:
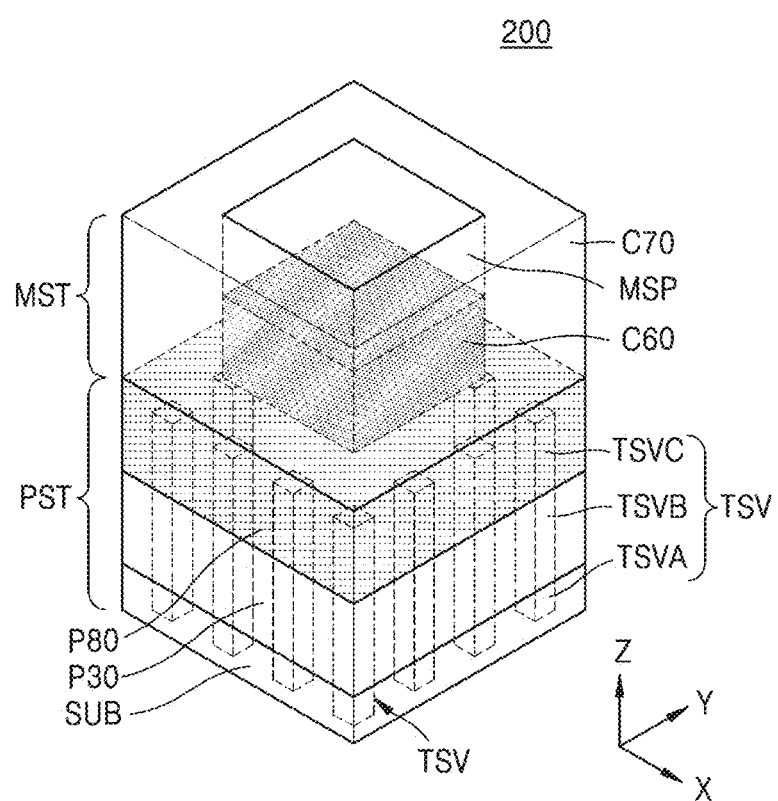
FIG. 3 is a perspective view illustrating a schematic structure of an integrated circuit device according to example embodiments of the inventive concepts.

FIG. 3 is a perspective view illustrating a schematic structure of an integrated circuit device 200 according to example embodiments of the inventive concepts. The integrated circuit device 200 may be another specific implementation of some of the example embodiments of the integrated circuit device 10 illustrated in FIG. 1.

Referring to FIG. 3, the integrated circuit device 200 may have substantially the same configuration as the integrated circuit device 100 illustrated in FIG. 2. However, the integrated circuit device 200 may include a plurality of through electrodes TSV instead of the plurality of through electrodes THV illustrated in FIG. 2. The plurality of through electrodes TSV may not penetrate the memory structure MST, but may penetrate only the peripheral circuit structure PST. The plurality of through electrodes TSV may be disposed at positions overlapping the memory cell insulation C70 in the peripheral circuit structure PST. Each of the plurality of through electrodes TSV may include a first portion TSVA penetrating the peripheral circuit board SUB, a second portion TSVB penetrating the peripheral circuit region P30, and a third portion TSVC penetrating a portion of the peripheral circuit interconnection unit P80. In example embodiments, each of the plurality of through electrodes TSV may be connected to at least one conductive pattern selected from among the plurality of conductive patterns included in the peripheral circuit interconnection unit P80. Each of the plurality of through electrodes TSV may be connected to the peripheral circuit 30 (see FIG. 1) in the peripheral circuit region P30 through the at least one conductive pattern.

There may not be a conductive bonding structure which is a result obtained by bonding the conductive bonding pattern included in the memory cell interconnection unit C60 to the conductive bonding pattern included in the peripheral circuit interconnection unit P80, in an electrical connection path between the plurality of through electrodes TSV and the peripheral circuit 30 (see FIG. 1) in the peripheral circuit region P30. Therefore, it may be possible to fundamentally block and/or reduce the increase in resistance due to the conductive bonding structure in the electrical connection path between the plurality of through electrodes TSV and the peripheral circuit 30 (see FIG. 1) in the peripheral circuit region P30.

In some example embodiments, an integrated circuit device may include both the through electrodes THV and TSV such that peripheral circuit interconnection unit P80 includes at least one conductive pattern selected from among the plurality of conductive patterns included in the peripheral circuit interconnection unit P80 connected to a through electrode THV, and at least one other conductive pattern selected from among the plurality of conductive patterns included in the peripheral circuit interconnection unit P80 connected to a through electrode TSV.

Figure 4A:
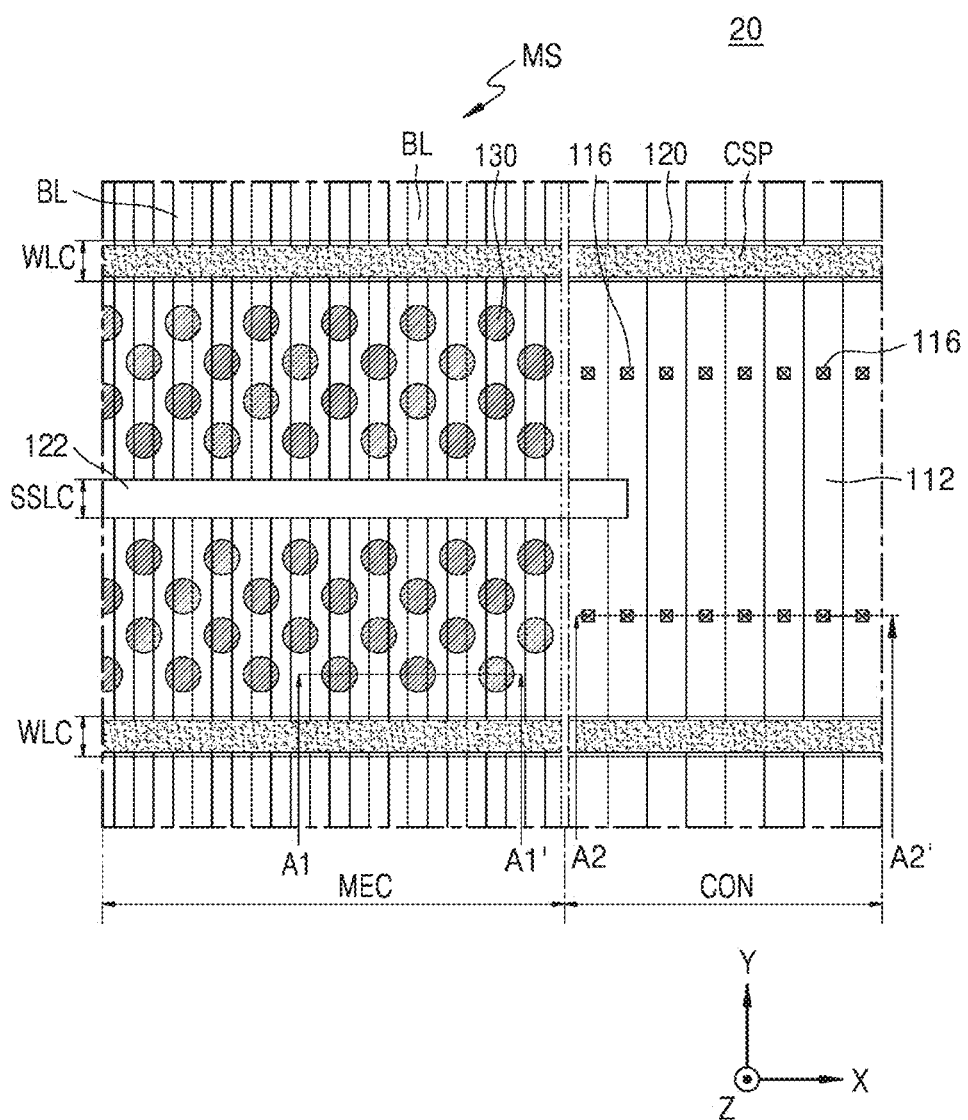
FIG. 4A is a plan view illustrating an example structure of some components of a memory cell array that may be included in an integrated circuit device according to example embodiments of the inventive concepts.
Figure 4B:
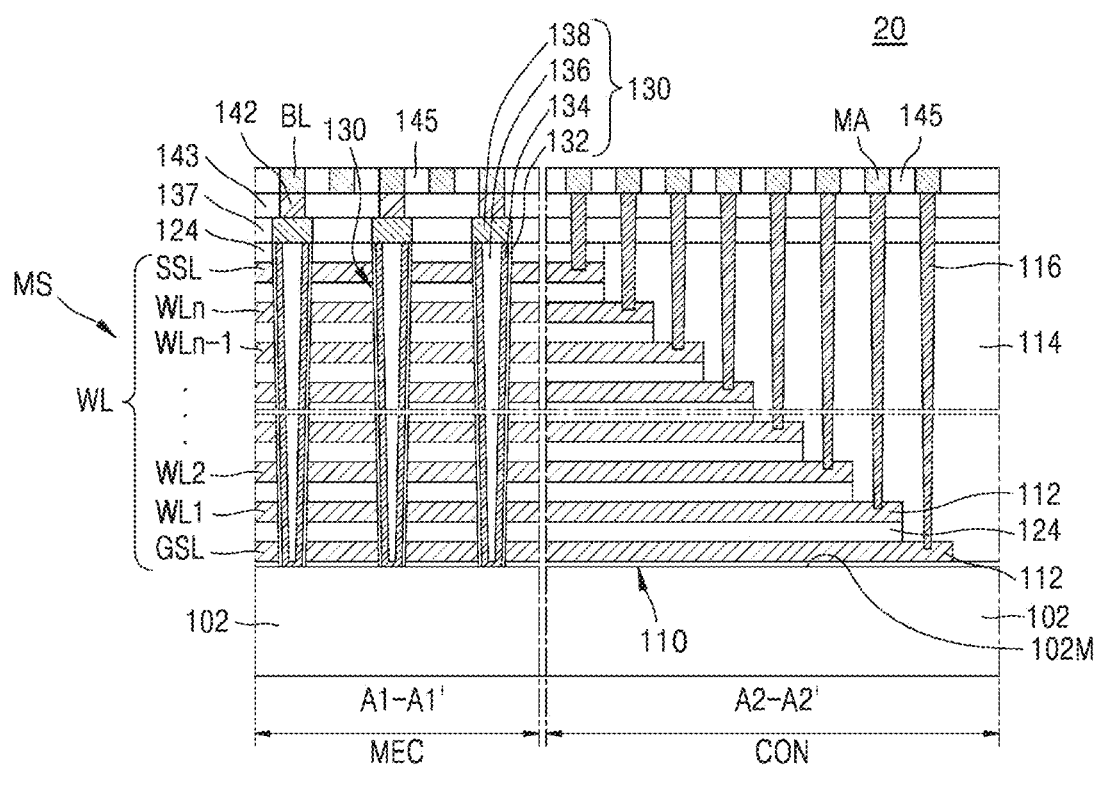
FIG. 4B is a cross-sectional view showing some components of cross sections taken along lines A1-A1' and A2-A2' of FIG. 4A.

FIG. 4A is a plan view illustrating an example structure of some components of the memory cell array 20 illustrated in FIG. 1, and FIG. 4B is a cross-sectional view illustrating some configurations of a cross-section taken along line A1-A1' and a cross-section taken along line A2-A2' of FIG. 4A.

Referring to FIGS. 4A and 4B, the memory cell array 20 may include a semiconductor layer 102 including a memory cell region MEC and a connection region CON. The semiconductor layer 102 may have a main surface 102M extending in the horizontal direction along an X-Y plane of FIG. 4B. The semiconductor layer 102 may include a single crystal semiconductor or a polycrystalline semiconductor. The semiconductor layer 102 may include Si, Ge, or SiGe. The connection region CON may be disposed adjacent to an edge side of the memory cell region MEC. FIGS. 4A and 4B illustrate that the connection region CON is only disposed on one side of the memory cell region MEC, but the connection region CON may be disposed on one or both sides of the memory cell region MEC in a first horizontal direction (the X direction).

The memory stack MS extending over the memory cell region MEC and the connection region CON may be formed on the semiconductor layer 102. The memory stack MS may include the plurality of word lines WL disposed in the memory cell region MEC, and a plurality of pad regions 112 disposed in the connection region CON and integrally connected to the plurality of word lines WL. The plurality of word lines WL may extend in the horizontal direction parallel to the main surface 102M of the semiconductor layer 102 and may overlap each other in the vertical direction (the Z direction). The plurality of pad regions 112 may be configured to form a stepped connection part 110 in the connection region CON.

The plurality of word lines WL may include the ground select line GSL and the string select line SSL. A stacked number of the plurality of word lines WL overlapping each other in the vertical direction (the Z direction) in the memory cell region MEC may be at least 48, 64, or 96, but the stacked number of the plurality of word lines WL is not limited to the above examples.

A plurality of word line cut regions WLC may extend in the first horizontal direction (the X direction) parallel to the main surface 102M of the semiconductor layer 102. The plurality of word line cut regions WLC may define a width of each of the plurality of word lines WL in a second horizontal direction (the Y direction).

A plurality of common source regions (not shown) may be formed to extend in the X direction in the semiconductor layer 102. In some example embodiments, the plurality of common source regions may include an impurity region heavily doped with n-type impurities. The plurality of common source regions may function as a source region for supplying current to vertical-type memory cells. A plurality of common source patterns CSP may extend in the X direction on the plurality of common source regions. The plurality of common source patterns CSP may be formed to fill a portion of the word line cut region WLC. The common source pattern CSP may be surrounded by an insulating spacer 120 in the word line cut region WLC. The insulating spacer 120 may include an oxide film, a nitride film, or a combination thereof.

Two string select lines SSL neighboring in the Y direction may be spaced apart from each other with a string select line cut region SSLC therebetween. The string select line cut region SSLC may be filled with an insulating film 122. The insulating film 122 may include an oxide film, a nitride film, and/or a combination thereof.

The plurality of word lines WL and the plurality of pad regions 112 may respectively include metal, metal silicide, a semiconductor doped with impurities, and/or combinations thereof. For example, each of the plurality of word lines WL may include metal such as W, Ni, Co, Ta, and/or the like, metal silicide such as tungsten silicide, nickel silicide, cobalt silicide, tantalum silicide, and/or the like, polysilicon doped with impurities, and/or combinations thereof.

A plurality of insulating films 124 may be between the semiconductor layer 102 and the ground select line GSL and between the plurality of word lines WL. The insulating film 124 closest to the semiconductor layer 102 among the plurality of insulating films 124 may have a thickness less than that of the other insulating films 124. The insulating film 124 furthest from the semiconductor layer 102 among the plurality of insulating films 124 may cover a top surface of the string select line SSL. The plurality of insulating films 124 may include silicon oxide, silicon nitride, and/or SiON.

In the memory cell region MEC, a plurality of channel structures 130 may extend in the vertical direction (the Z direction) through the plurality of word lines WL and the plurality of insulating films 124. The plurality of channel structures 130 may be arranged to be spaced apart from each other at predetermined, or desired, intervals in the X and Y directions. The plurality of channel structures 130 may include a gate dielectric film 132, a channel region 134, a buried insulating film 136, and a drain region 138, respectively. The channel region 134 may include doped polysilicon and/or undoped polysilicon. The channel region 134 may have a cylindrical shape, although other shapes may be used. An internal space of the channel region 134 may be filled with the buried insulating film 136. The buried insulating film 136 may include an insulating material. For example, the buried insulating film 136 may include silicon oxide, silicon nitride, SiON, and/or combinations thereof. The drain region 138 may include polysilicon doped with impurities, metal, conductive metal nitride, or combinations thereof. Examples of the metal that may constitute the drain region 138 may include W, Ni, Co, Ta, and/or the like. The plurality of drain regions 138 may be insulated from each other by an insulating film 137. The insulating film 137 may include an oxide film, a nitride film, and/or a combination thereof.

In the memory cell region MEC, a plurality of bit lines BL may be disposed on the plurality of word lines WL and the plurality of channel structures 130. The plurality of bit lines BL may be disposed in parallel to each other and may extend in the Y direction. A plurality of bit line contact pads 142 may be between the plurality of channel structures 130 and the plurality of bit lines BL. The drain region 138 may be connected to one corresponding bit line BL among the plurality of bit lines BL through the bit line contact pad 142. The plurality of bit line contact pads 142 may be insulated from each other by an insulating film 143. The plurality of bit lines BL may be insulated from each other by an insulating film 145. The plurality of bit line contact pads 142 and the plurality of bit lines BL may include metal, metal nitride, or a combination thereof. For example, the plurality of bit line contact pads 142 and the plurality of bit lines BL may have the same material or different materials, and include W, Ti, Ta, Cu, Al, Ti, TiN, TaN, WN, and/or combinations thereof. The insulating film 143 and the insulating film 145 may have the same material or different materials, and include an oxide film, a nitride film, and/or a combination thereof.

An insulating film 114 covering the stepped connection part 110 may be between the semiconductor layer 102 and the insulating film 137 in the connection region CON. The insulating film 114 may cover the plurality of pad regions 112. In the connection region CON, a plurality of contact plugs 116 may be connected to the stepped connection part 110. The plurality of contact plugs 116 may extend from the plurality of pad regions 112 through the insulating films 114, 137, and 143 in the vertical direction (the Z direction). A plurality of interconnection layers MA may be formed on the plurality of contact plugs 116. The plurality of interconnection layers MA may be connected to the plurality of contact plugs 116. The plurality of interconnection layers MA may be configured to be electrically connectable to the word lines WL through the plurality of contact plugs 116, respectively. The plurality of interconnection layers MA may be formed at the same level as the plurality of bit lines BL. Herein, the term "level" may mean a distance in the vertical direction (Z direction or −Z direction) from the main surface 102M of the semiconductor layer 102. In the connection region CON, the plurality of interconnection layers MA may be insulated from each other by the insulating film 145. The plurality of contact plugs 116 and the plurality of interconnection layers MA may each include W, Ti, Ta, Cu, Al, Ti, TiN, TaN, WN, and/or combinations thereof.

Figure 5A:
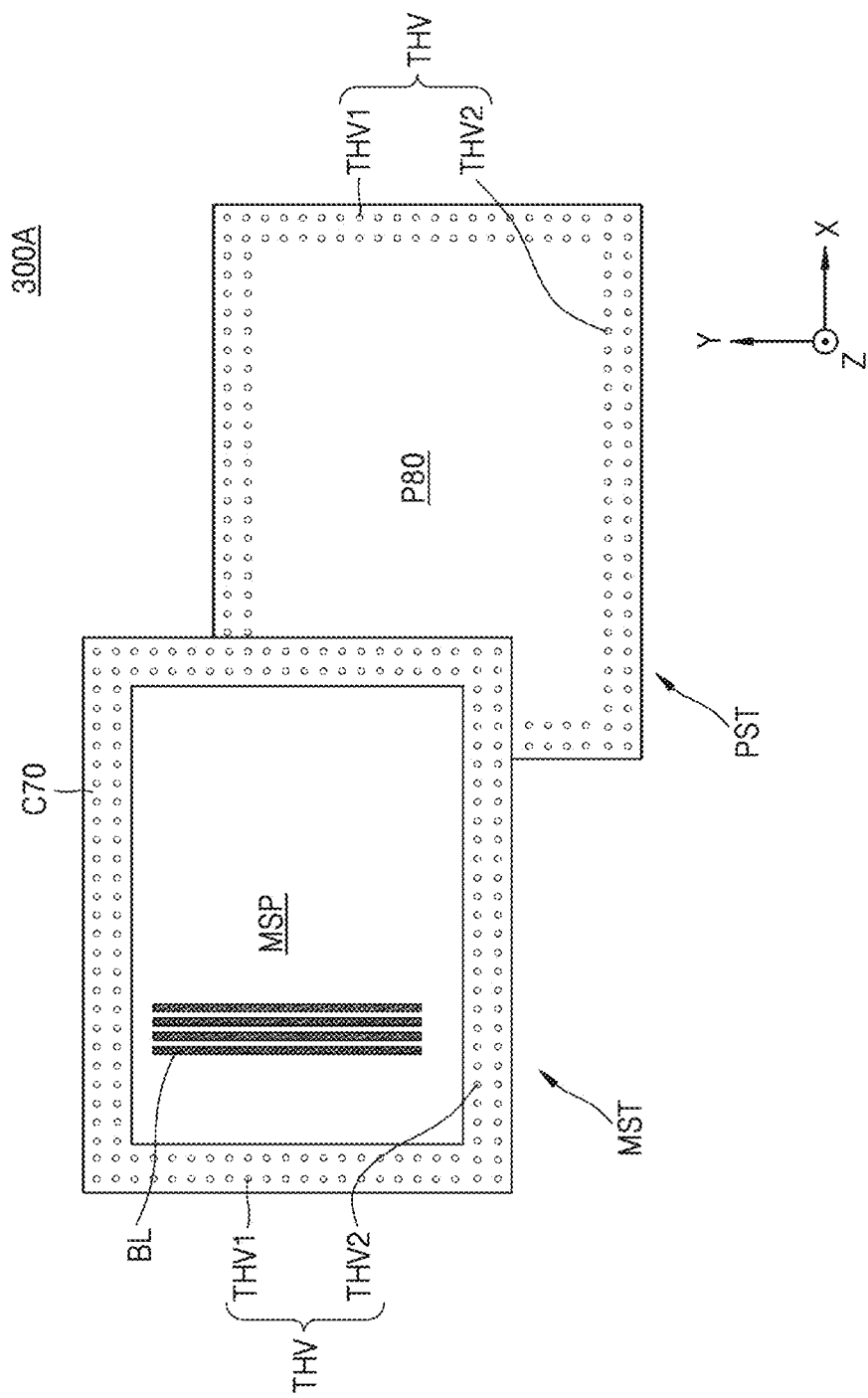
FIGS. 5A and 5B are exploded plan views respectively illustrating some components of an integrated circuit device according to example embodiments of the inventive concepts.

FIG. 5A is an exploded plan view illustrating some components of an integrated circuit device 300A according to still other example embodiments of the inventive concepts. The integrated circuit device 300A may have substantially the same configuration as the integrated circuit device 100 illustrated in FIG. 2. The integrated circuit device 300A may include the plurality of through electrodes THV. However, the plurality of through electrodes THV may be arranged to surround four sides of the memory stack unit MSP included in the memory structure MST. A plurality of through electrodes THV1, which is a portion of the plurality of through electrodes THV, may be arranged in a line in an extension direction (the Y direction) of the plurality of bit lines BL included in the memory stack unit MSP. A plurality of through electrodes THV2, which is another portion of the plurality of through electrodes THV, may be arranged in a line in a width direction (the X direction) of the plurality of bit lines BL included in the memory stack unit MSP.

Figure 5B:
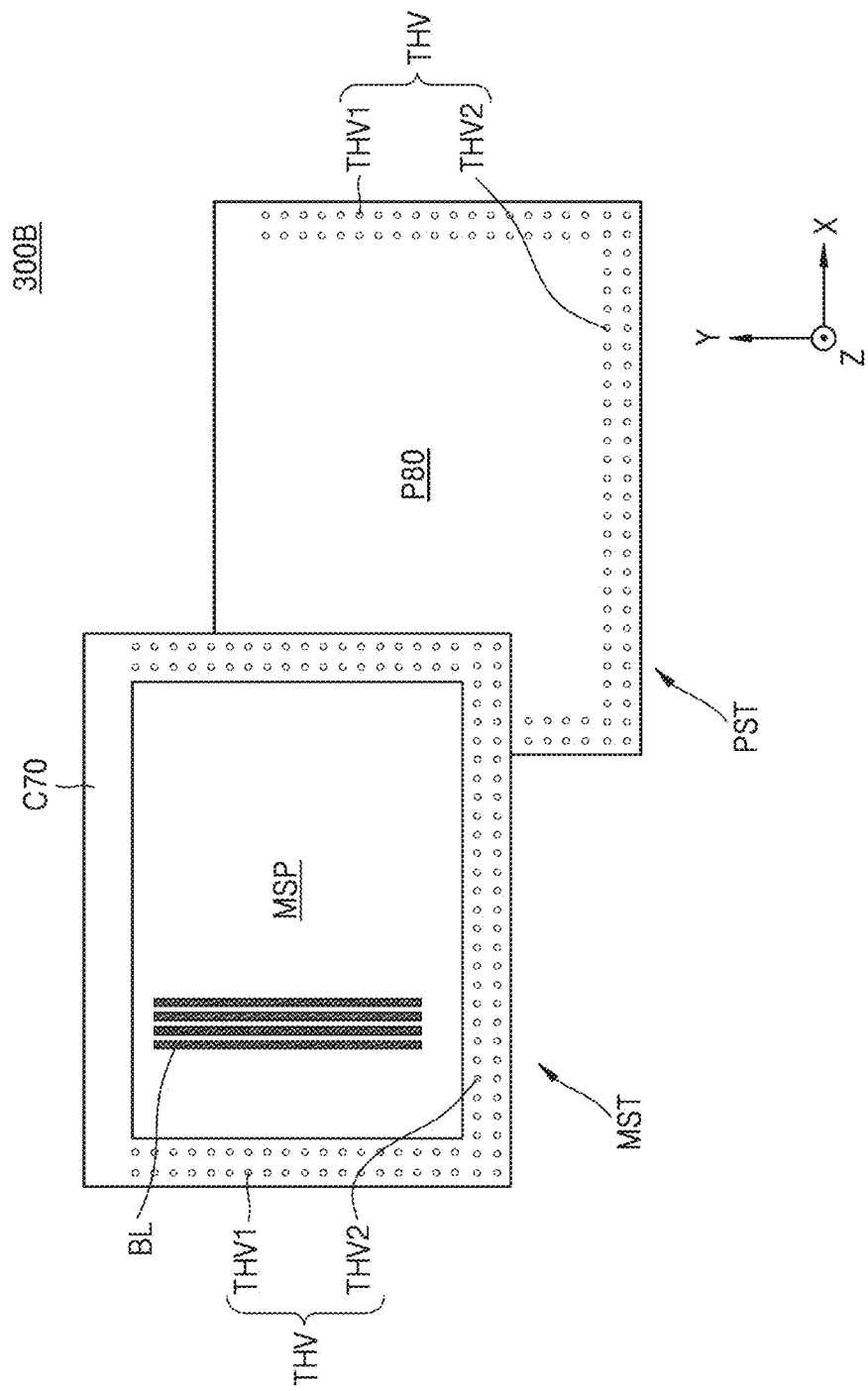

FIG. 5B is an exploded plan view illustrating some components of an integrated circuit device 300B according to still other example embodiments of the inventive concepts. The integrated circuit device 300B may have substantially the same configuration as the integrated circuit device 300A illustrated in FIG. 5A. However, in the integrated circuit device 300B, the plurality of through electrodes THV may be arranged to surround three sides of the memory stack unit MSP included in the memory structure MST.

FIGS. 5A and 5B illustrate configurations in which at least three sides of the memory stack unit MSP of the memory structure MST are arranged to be surrounded by the plurality of through electrodes THV, but the inventive concepts are not limited to the illustrations in FIGS. 5A and 5B. For example, the plurality of through electrodes THV may be disposed to surround one side or two sides of the memory stack unit MSP.

Figure 6:
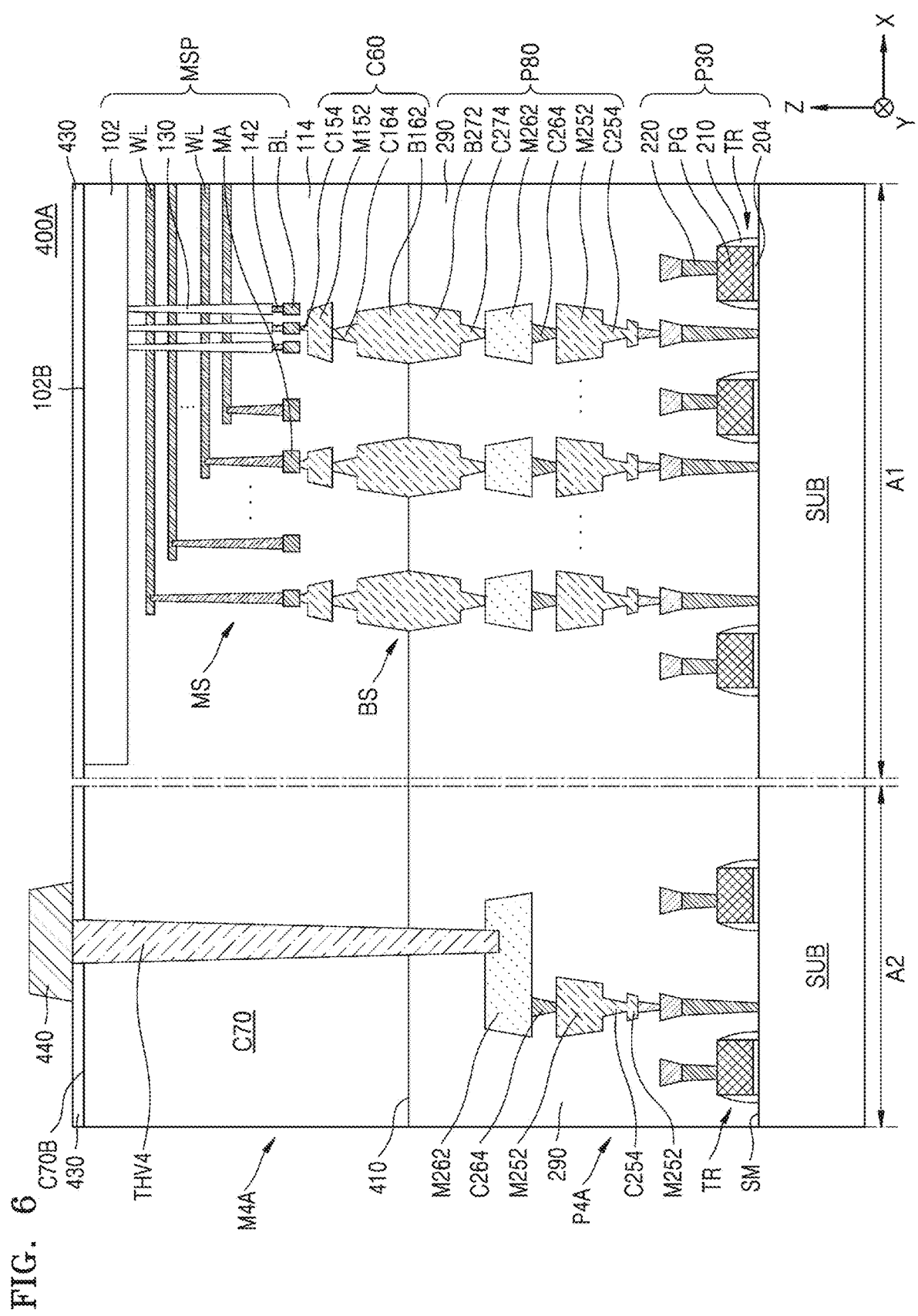
FIGS. 6 to 13 are cross-sectional views illustrating an integrated circuit devices according to example embodiments of the inventive concepts.

FIG. 6 is a cross-sectional view illustrating an integrated circuit device 400A according to example embodiments of the inventive concepts.

Referring to FIG. 6, the integrated circuit device 400A may include a memory structure M4A and a peripheral circuit structure P4A, which are bonded to each other.

The memory structure M4A may include the memory stack unit MSP, the memory cell interconnection unit C60, and the memory cell insulation unit C70 surrounding the memory stack unit MSP and the memory cell interconnection unit C60.

The memory stack unit MSP may include the memory stack MS. The detailed configuration of the memory stack MS is the same as those described with reference to FIGS. 4A and 4B. In FIG. 6, some components of the memory stack MS are omitted for the simplicity of the drawings. The memory cell interconnection unit C60 may include a plurality of upper conductive patterns M152 and B162 configured to be electrically connected to the memory stack MS of the memory stack unit MSP. A plurality of contact plugs C154 may be between the plurality of bit lines BL and the upper conductive pattern M152, and between the plurality of interconnection layers MA and the upper conductive pattern M152, and a plurality of contact plugs C164 may be between the upper conductive pattern M152 and the upper conductive pattern B162. The memory cell insulation unit C70 may include an oxide film, a nitride film, a polymer film, and/or combinations thereof. The memory cell insulation unit C70 may be integrally connected to an insulating film 114 covering the memory stack MS.

The peripheral circuit structure P4A may include the peripheral circuit board SUB, the peripheral circuit region P30 and the peripheral circuit interconnection unit P80 sequentially formed on the peripheral circuit board SUB.

The peripheral circuit board SUB may include a first region A1 overlapping the memory stack unit MSP in the vertical direction (the Z direction) and a second region A2 overlapping the memory cell insulation unit C70 in the vertical direction (the Z direction). The peripheral circuit board SUB may have a main surface SM extending in the horizontal direction along the X-Y plane. In example embodiments, the peripheral circuit board SUB may include Si, Ge, or SiGe. In other example embodiments, the peripheral circuit board SUB may include a polysilicon film, a silicon-on-insulator (SOI) structure, or a germanium-on-insulator (GeOI) structure.

The peripheral circuit 30 described with reference to FIG. 1 may be formed in the peripheral circuit region P30. The peripheral circuit region P30 may include a plurality of transistors TR formed on an active region of the peripheral circuit board SUB. Each of the transistors TR may include a gate PG and source/drain regions (not shown) formed in the active region of the peripheral circuit board SUB at both sides of the gate PG. A gate insulating film 204 may be between the peripheral circuit board SUB and the gate PG, and both sidewalls of the gate PG may be covered with insulating spacers 210. A plurality of contact plugs 220 may be connected to the plurality of transistors TR. The peripheral circuit region P30 may further include unit devices such as a resistor and a capacitor.

The peripheral circuit interconnection unit P80 may be between the peripheral circuit region P30 and the memory structure M4A. The peripheral circuit interconnection unit P80 may have a multilayer interconnection structure including a plurality of lower conductive patterns M252, M262, and B272 and a plurality of contact plugs C254, C264, and C274. The number of layers of the multilayer interconnection structure is not limited to the illustration in FIG. 6, and may have the multilayer interconnection structure having various number of layers as necessary. At least some of the plurality of lower conductive patterns M252, M262, and B272 and the plurality of contact plugs C254, C264, and C274 may be electrically connected to the plurality of transistors TR in the peripheral circuit region P30.

The plurality of contact plugs 220, the plurality of lower conductive patterns M252, M262, and B272, and the plurality of contact plugs C254, C264, and C274 may include metal, conductive metal nitride, metal silicide, and/or combinations thereof, respectively. In example embodiments, the plurality of contact plugs 220, the plurality of lower conductive patterns M252, M262, and B272, and the plurality of contact plugs C254, C264, and C274 may include W, Al, Cu, Mo, Ti, Co, Ta, Ni, tungsten silicide, titanium silicide, cobalt silicide, tantalum silicide, nickel silicide, and/or combinations thereof. For example, the plurality of contact plugs 220, the plurality of lower conductive patterns M252, M262, and B272, and the plurality of contact plugs C254, C264, and C274 may respectively include a metal pattern including W, Al, or Cu and a conductive barrier film surrounding the metal pattern. The conductive barrier film may include Ti, TiN, Ta, TaN, and/or combinations thereof.

Conductive regions included in the peripheral circuit region P30 and the peripheral circuit interconnection unit P80 may be covered with an interlayer insulating film 290. The interlayer insulating film 290 may include silicon oxide, silicon nitride, SiON, and/or SiOCN.

The memory cell interconnection unit C60 and the peripheral circuit interconnection unit P80 may be bonded to each other. In the first region A1, a plurality of conductive bonding structures BS may be disposed along a boundary 410 between the memory cell interconnection unit C60 and the peripheral circuit interconnection unit P80, which are bonded to each other. Each of the plurality of conductive bonding structures BS may include a bonding result of the upper conductive pattern B162 included in the memory cell interconnection unit C60 and the lower conductive pattern B272 included in the peripheral circuit interconnection unit P80. The upper conductive pattern B162 and the lower conductive pattern B272 constituting each of the plurality of conductive bonding structures BS may have a structure in which they are integrally coupled to each other without the boundary between them.

A back surface 102B of the semiconductor layer 102 and a back surface C70B of the memory cell insulation unit C70 may be covered with an insulating film 430. The insulating film 430 may include a silicon oxide film, a silicon nitride film, and/or a polymer film. A conductive pad 440 may be formed on the insulating film 430. The conductive pad 440 may be spaced apart from the memory structure M4A with the insulating film 430 therebetween. The conductive pad 440 may extend in the horizontal direction along the X-Y plane outside the memory structure M4A. The conductive pad 440 may not include a portion overlapping the memory stack MS in the vertical direction (the Z direction).

In example embodiments, the conductive pad 440 may include a stacked structure of a first conductive film and a second conductive film. The first conductive film may include Ti, Cu, Ni, Au, NiV, NiP, TiNi, TiW, TaN, Al, Pd, CrCu, and/or combinations thereof. For example, the first conductive film may include a Cr/Cu/Au stacked structure, a Cr/CrCu/Cu stacked structure, a TiWCu compound, a TiWCu/Cu stacked structure, a Ni/Cu stacked structure, a NiV/Cu stacked structure, a Ti/Ni stacked structure, a Ti/NiP stacked structure, a TiWNiV compound, an Al/Ni/Au stacked structure, an Al/NiP/Au stacked structure, a stacked structure of Ti/TiNi/CuNi compound, a Ti/Ni/Pd stacked structure, a Ni/Pd/Au stacked structure, or a NiP/Pd/Au stacked structure. The second conductive film may include Ni, Cu, Al, and/or combinations thereof.

A through electrode THV4 may be disposed in the second region A2, in which the through electrode THV4 may penetrate the insulating film 430 and the memory cell insulation unit C70, and may extend to the peripheral circuit interconnection unit P80 in the vertical direction (the Z direction). The through electrode THV4 may extend to a lower conductive pattern M262 through a portion of the interlayer insulating film 290 included in the peripheral circuit interconnection unit P80. One end of the through electrode THV4 may be in contact with the lower conductive pattern M262, and the other end of the through electrode THV4 may be in contact with the conductive pad 440. The through electrode THV4 may include at least one metal selected from among W, Au, Ag, Cu, Al, TiAlN, WN, Ir, Pt, Pd, Ru, Zr, Rh, Ni, Co, Cr, Sn, and/or Zn. In example embodiments, the through electrode THV4 may include a metal film including W and a conductive barrier film surrounding the metal film. The conductive barrier film may include Ti, TiN, Ta, TaN, and/or combinations thereof.

Although one through electrode THV4 is illustrated in FIG. 6, the integrated circuit device 400A may include a plurality of through electrodes THV4 in the second region A2, in which the through electrode THV4 may penetrate the insulating layer 430 and the memory cell insulation unit C70 and may extend to the peripheral circuit interconnection unit P80 in the vertical direction (the Z direction). As described with respect to the plurality of through electrodes THV with reference to FIG. 5A or 5B, the plurality of through electrodes THV4 may include the plurality of through electrodes THV1 arranged in a line in the extension direction (the Y direction) of the plurality of bit lines BL included in the memory stack unit MSP and the plurality of through electrodes THV2 arranged in a line in the width direction (the X direction) of the plurality of bit lines BL.

In the peripheral circuit interconnection unit P80, the lower conductive pattern M262 contacting one end of the through electrode THV4 may be formed at a different level than the lower conductive pattern B272 constituting the plurality of conductive bonding structures BS. Herein, the term "level" means a distance in the vertical direction (Z direction or −Z direction) from the main surface SM of the peripheral circuit board SUB. The shortest distance from the main surface SM of the peripheral circuit board SUB to the lower conductive pattern B272 which constitutes the conductive bonding structure BS, may be greater than the shortest distance from the main surface SM to the lower conductive pattern M262, which is in contact with one end of the through electrode THV4. The lower conductive pattern B272 constituting the conductive bonding structure BS may be disposed along the boundary 410 between the memory cell interconnection unit C60 and the peripheral circuit interconnection unit P80, and the lower conductive pattern M262 in contact with one end of the through electrode THV4 may be spaced apart from the boundary 410 between the memory cell interconnection unit C60 and the peripheral circuit interconnection unit P80 in a direction approaching the peripheral circuit board SUB.

The lower conductive pattern M262 contacting one end of the through electrode THV4 and the lower conductive pattern B272 constituting the plurality of conductive bonding structures BS may include different metals. In example embodiments, the lower conductive pattern M262 contacting one end of the through electrode THV4 may include A1, and the lower conductive pattern B272 constituting the conductive bonding structure BS may include Cu.

The lower conductive pattern M262 contacting one end of the through electrode THV4 and the lower conductive pattern B272 constituting the plurality of conductive bonding structures BS may have different cross-sectional shapes in the vertical direction (the Z direction). In example embodiments, the lower conductive pattern M262 contacting one end of the through electrode THV4 may have a cross-sectional shape in which a width in the horizontal direction along the X-Y plane decreases as the lower conductive pattern M262 becomes closer toward the conductive structure M4A, and the lower conductive pattern B272 constituting the bonding structure BS may have the cross-sectional shape in which the width in the horizontal direction along the X-Y plane increases as the lower conductive pattern B272 becomes closer toward the memory structure M4A.

The conductive bonding structure BS may not exist in an electrical connection path between the through electrode THV4 and the peripheral circuits in the peripheral circuit region P30. Thus, the increase in resistance due to the conductive bonding structure BS in the electrical connection path between the through electrode THV4 and the peripheral circuits in the peripheral circuit region P30 may be reduced or prevented. In particular, when the through electrode THV4 is connected to a circuit used for inputting/outputting data, addresses, or commands, such as the data input/output circuit 36 described with reference to FIG. 1, an ESD circuit, a pull-up/pull-down driver, or a circuit sensitive to resistance, the reliability of the integrated circuit device 400A may be improved by reducing the resistance in the electrical connection path via the through electrode THV4.

Figure 7:
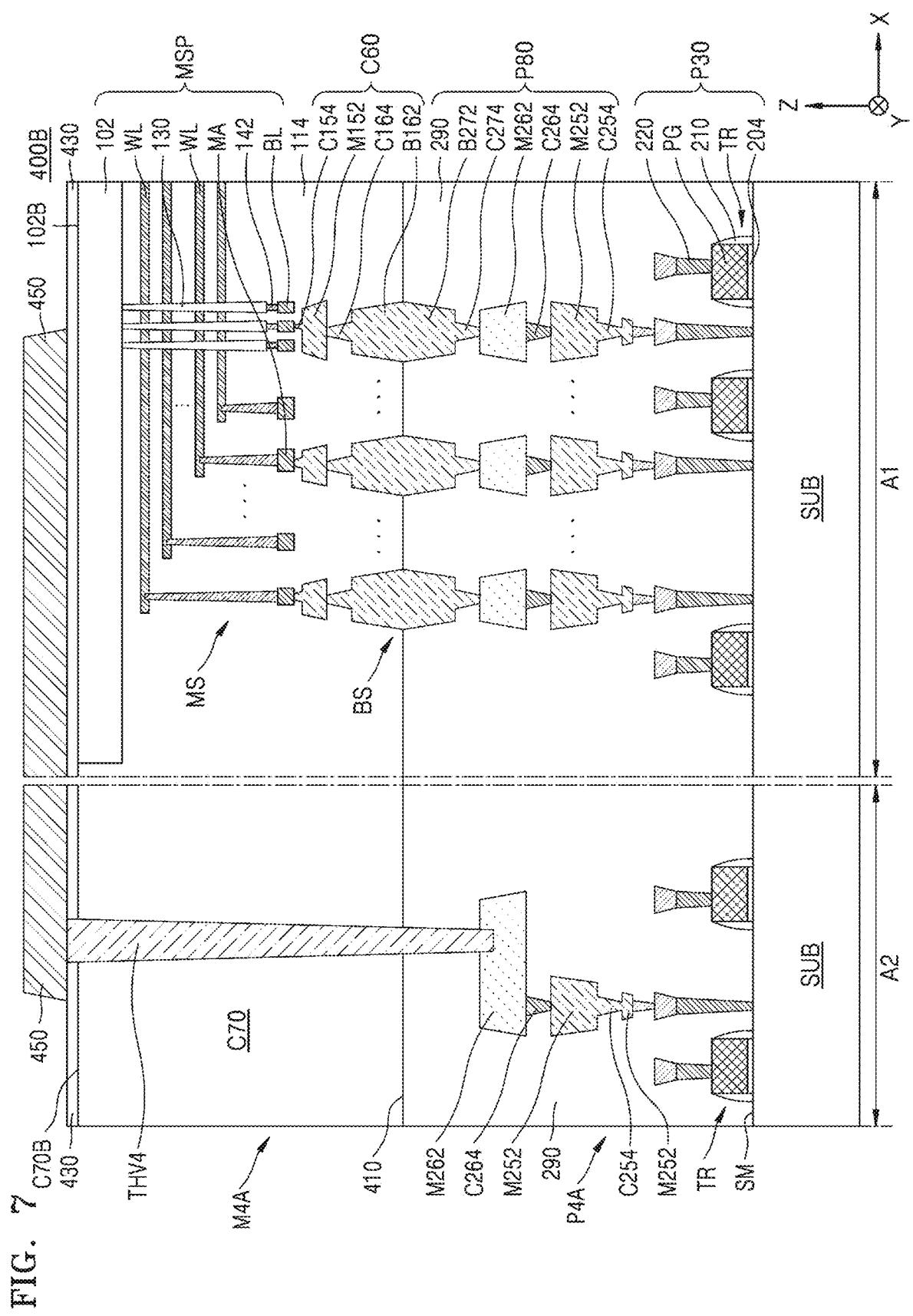

FIG. 7 is a cross-sectional view illustrating an integrated circuit device 400B according to example embodiments of the inventive concepts.

Referring to FIG. 7, the integrated circuit device 400B may have substantially the same configuration as the integrated circuit device 400A described with reference to FIG. 6. However, the integrated circuit device 400B may include a conductive pad 450 formed on the insulating film 430. The conductive pad 450 may have substantially the same configuration as the conductive pad 440 described with reference to FIG. 6. However, the conductive pad 450 may include a portion overlapping the memory stack MS in the vertical direction (the Z direction). Therefore, an area in which the conductive pads 450 may extend outwardly beyond the memory structure M4A in the horizontal direction may be reduced, thereby reducing the increase of a planar size of a chip due to the conductive pads 450. Therefore, it may contribute to reducing the planar size of the chip including the integrated circuit device 400B.

Figure 8:
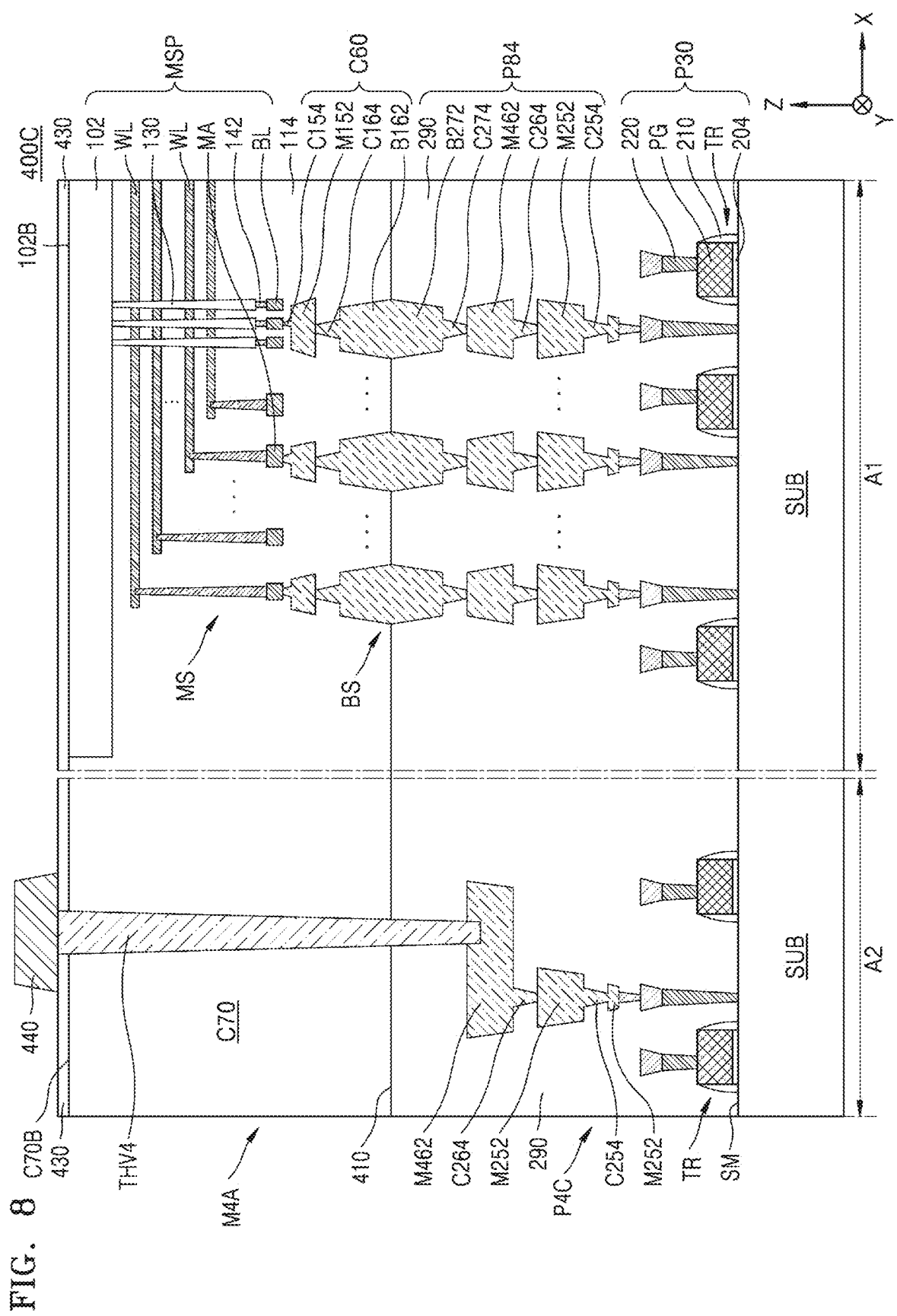

FIG. 8 is a cross-sectional view illustrating an integrated circuit device 400C according to example embodiments of the inventive concepts.

Referring to FIG. 8, the integrated circuit device 400C may have substantially the same configuration as the integrated circuit device 400A described with reference to FIG. 6. However, the peripheral circuit structure P4C of the integrated circuit device 400C may include a peripheral circuit interconnection unit P84. The peripheral circuit interconnection unit P84 may have a multilayer interconnection structure including a plurality of lower conductive patterns M252, M462, and B272 and a plurality of contact plugs C254, C264, and C274.

The memory cell interconnection unit C60 and the peripheral circuit interconnection unit P80 may be bonded to each other. In the first region A1, the plurality of conductive bonding structures BS may be disposed along the boundary 410 between the memory cell interconnection unit C60 and the peripheral circuit interconnection unit P80, which are bonded to each other.

In the second region A2, the through electrode THV4 may extend to the peripheral circuit interconnection unit P84 in the vertical direction (the Z direction), through the insulating layer 430 and the memory cell insulation unit C70. The through electrode THV4 may extend to the lower conductive pattern M462 included in the peripheral circuit interconnection unit P84. One end of the through electrode THV4 may be in contact with the lower conductive pattern M462.

The lower conductive pattern M462 contacting one end of the through electrode THV4 and the lower conductive pattern B272 constituting the plurality of conductive bonding structures BS may be formed at different levels. The shortest distance from the main surface SM of the peripheral circuit board SUB to the lower conductive pattern B272 which constitutes the conductive bonding structure BS, may be greater than the shortest distance from the main surface SM to the lower conductive pattern M462 which is in contact with one end of the through electrode THV4.

The lower conductive pattern M462 contacting one end of the through electrode THV4 and the lower conductive pattern B272 constituting the plurality of conductive bonding structures BS may include the same metal. In example embodiments, the lower conductive pattern M462 contacting one end of the through electrode THV4 and the lower conductive pattern B272 constituting the conductive bonding structure BS may include Cu, respectively.

The lower conductive pattern M462 contacting one end of the through electrode THV4 and the lower conductive pattern B272 constituting the conductive bonding structure BS may have the cross-sectional shape in which the width in the horizontal direction along the X-Y plane increases as they become closer toward the memory structure M4A, respectively.

Figure 9:
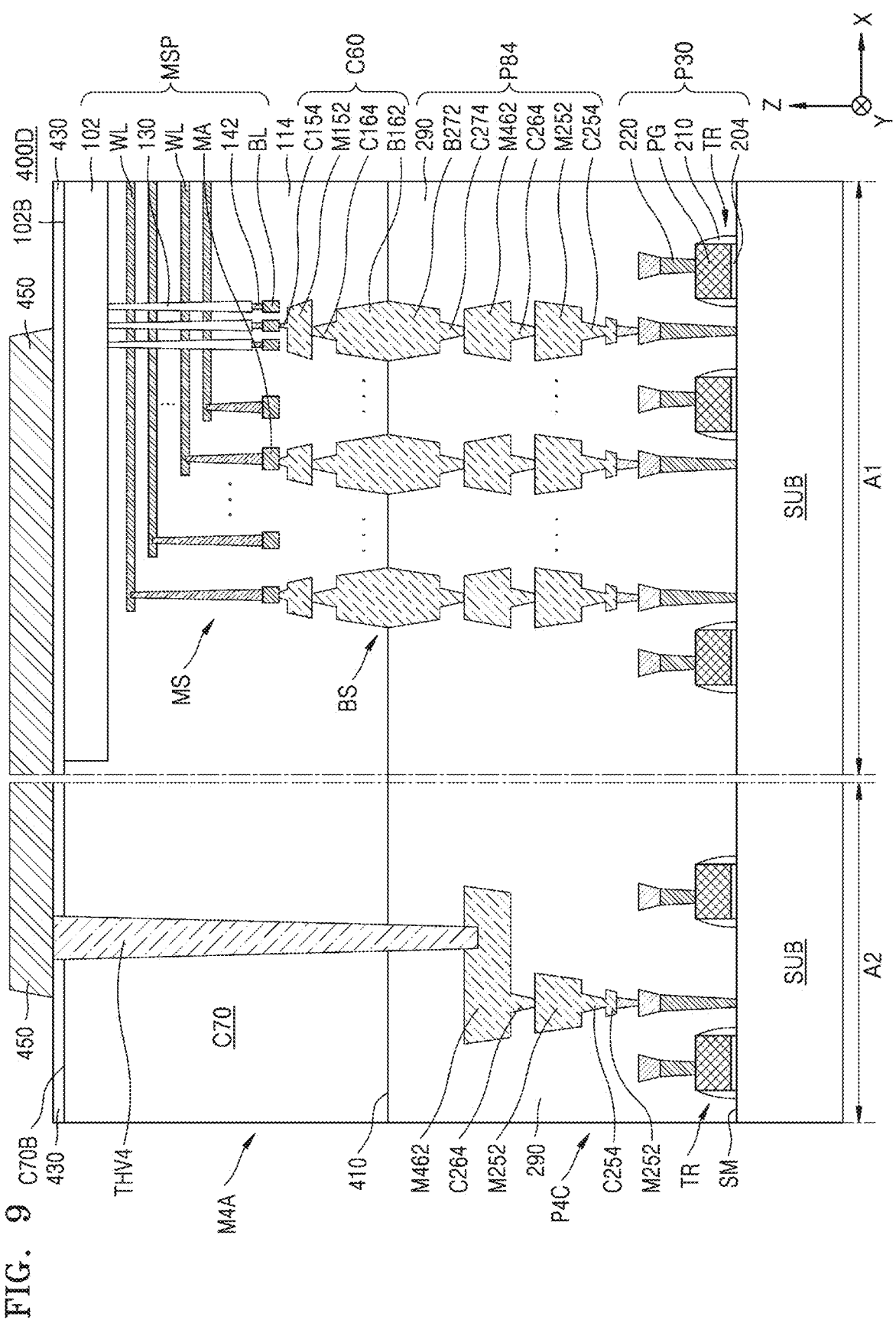

FIG. 9 is a cross-sectional view illustrating an integrated circuit device 400D according to example embodiments of the inventive concepts.

Referring to FIG. 9, the integrated circuit device 400D may have substantially the same configuration as the integrated circuit device 400C described with reference to FIG. 8. However, the integrated circuit device 400D may include the conductive pad 450 formed on the insulating film 430. The conductive pad 450 may include a portion overlapping the memory stack MS in the vertical direction (the Z direction).

Figure 10:
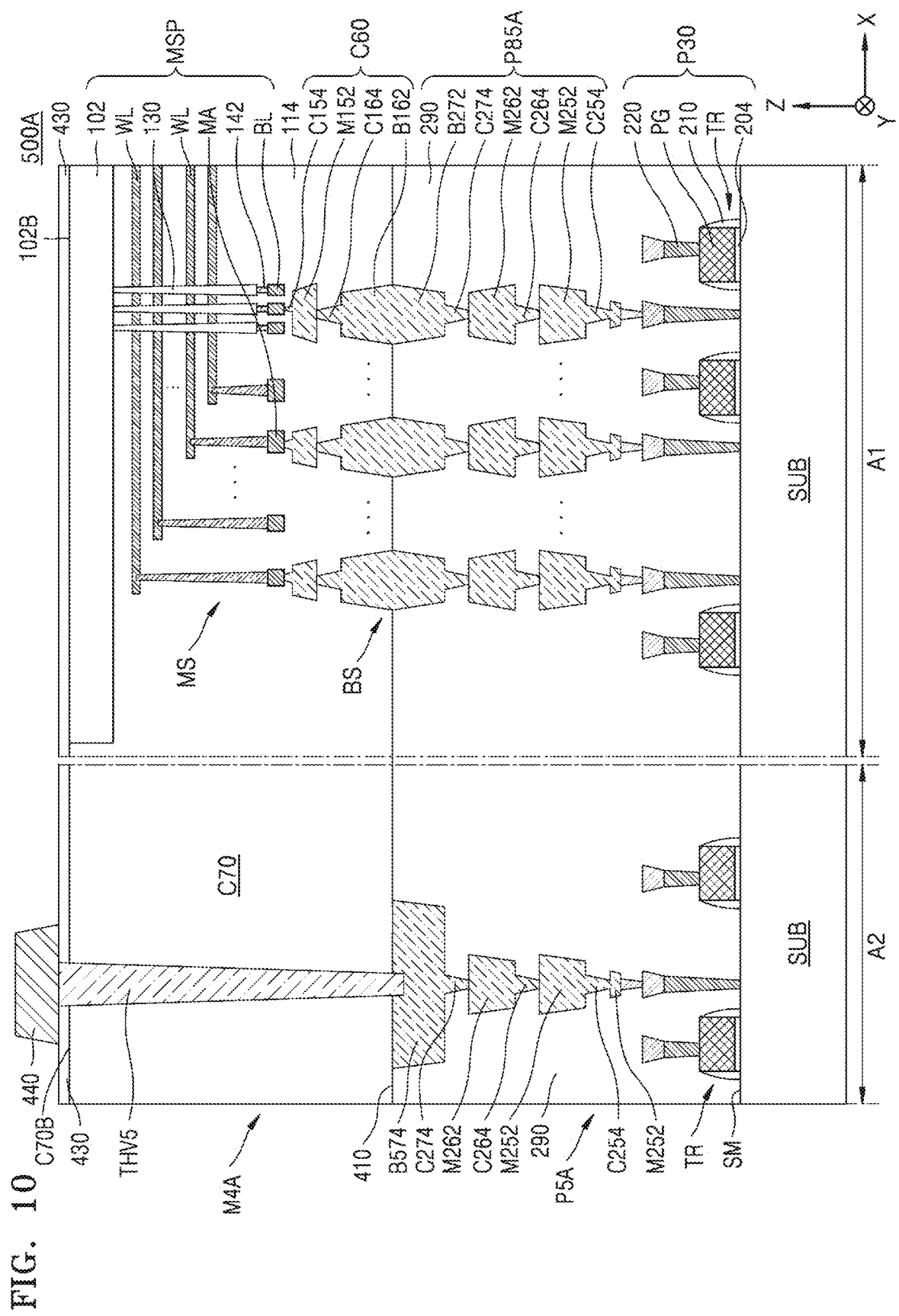

FIG. 10 is a cross-sectional view illustrating an integrated circuit device 500A according to example embodiments of the inventive concepts.

Referring to FIG. 10, the integrated circuit device 500A may have substantially the same configuration as the integrated circuit device 400A described with reference to FIG. 6. However, the peripheral circuit structure P5A of the integrated circuit device 500A may include a peripheral circuit interconnection unit P85A. The peripheral circuit interconnection unit P85A may have a multilayer interconnection structure including a plurality of lower conductive patterns M252, M262, B272 and B574 and a plurality of contact plugs C254, C264, and C274.

The memory cell interconnection unit C60 and the peripheral circuit interconnection unit P85A may be bonded to each other. In the first region A1, the plurality of conductive bonding structures BS may be disposed along the boundary 410 between the memory cell interconnection unit C60 and the peripheral circuit interconnection unit P85A, which are bonded to each other.

In the second region A2, a through electrode THV5 may extend to the peripheral circuit interconnection unit P85A in the vertical direction (the Z direction), through the insulating layer 430 and the memory cell insulation unit C70. The through electrode THV5 may extend to the lower conductive pattern B574 included in the peripheral circuit interconnection unit P85A. One end of the through electrode THV5 may be in contact with the lower conductive pattern B574, and the other end of the through electrode THV5 may be in contact with the conductive pad 440. More detailed configuration with respect to the through electrode THV5 may be substantially the same as that described with respect to the through electrode THV4 with reference to FIG. 6.

The lower conductive pattern B574 and the lower conductive pattern B272 may be formed at the same level. The shortest distance from the main surface SM of the peripheral circuit board SUB to the lower conductive pattern B272 may be approximately the same as or similar to the shortest distance from the main surface SM to the lower conductive pattern B574. The lower conductive pattern B574 and the lower conductive pattern B272 may include the same metal. In example embodiments, the lower conductive pattern B574 and the lower conductive pattern B272 may respectively include Cu. The lower conductive pattern B574 and the lower conductive pattern B272 may have the cross-sectional shape in which the width in the horizontal direction along the X-Y plane increases as they become closer toward the memory structure M4A, respectively.

The conductive bonding structure BS may not exist in an electrical connection path between the through electrode THV5 and peripheral circuits in the peripheral circuit region P30. Thus, the increase in resistance due to the conductive bonding structure BS in the electrical connection path between the through electrode THV5 and the peripheral circuits in the peripheral circuit region P30 may be reduced or prevented.

Figure 11:
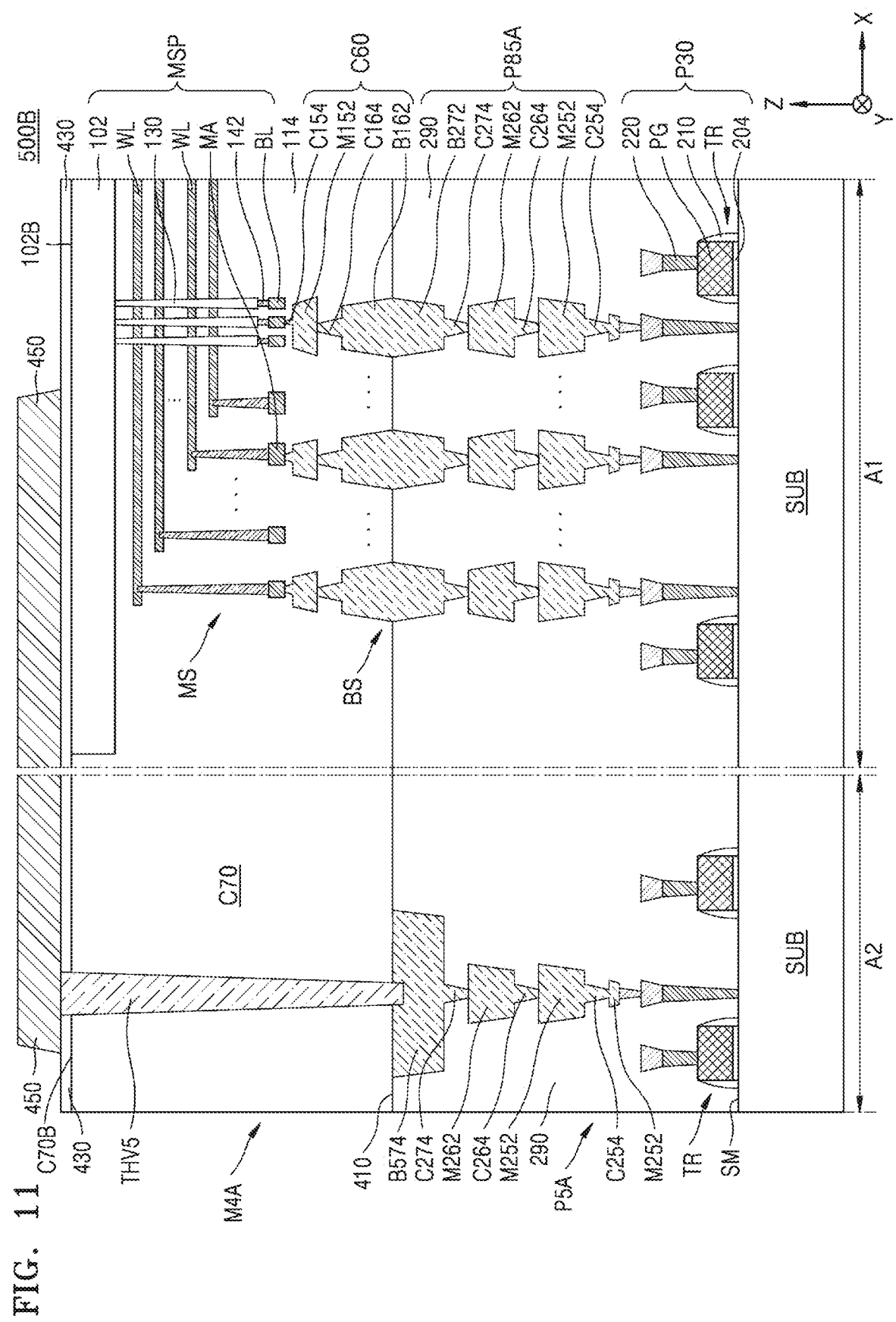

FIG. 11 is a cross-sectional view illustrating an integrated circuit device 500B according to example embodiments of the inventive concepts.

Referring to FIG. 11, the integrated circuit device 500B may have substantially the same configuration as the integrated circuit device 500A described with reference to FIG. 10. However, the integrated circuit device 500B may include the conductive pad 450 formed on the insulating film 430. The conductive pad 450 may include a portion overlapping the memory stack MS in the vertical direction (the Z direction).

Figure 12:
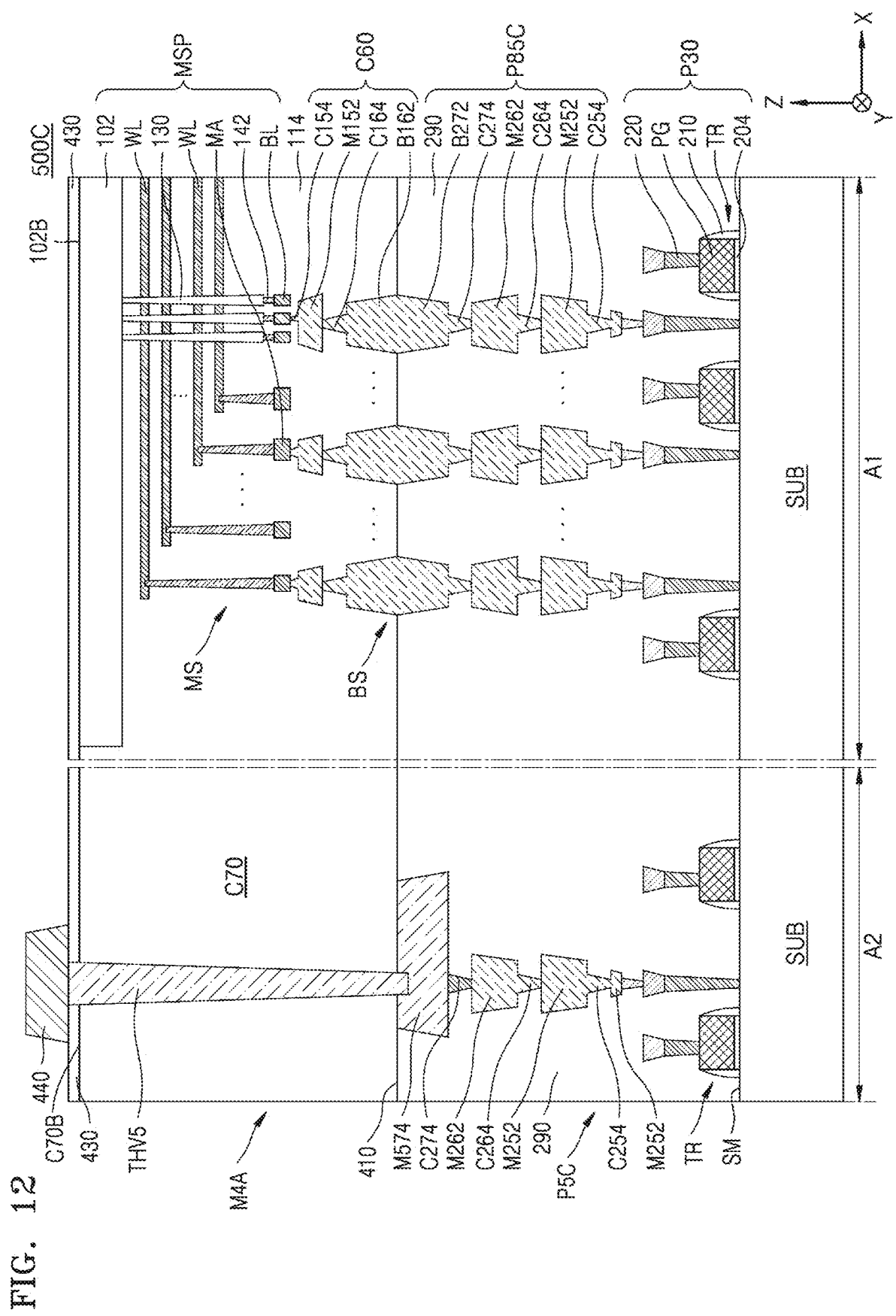

FIG. 12 is a cross-sectional view illustrating an integrated circuit device 500C according to example embodiments of the inventive concepts.

Referring to FIG. 12, the integrated circuit device 500C may have substantially the same configuration as the integrated circuit device 400A described with reference to FIG. 6. However, the peripheral circuit structure P5C of the integrated circuit device 500C may include a peripheral circuit interconnection unit P85C. The peripheral circuit interconnection unit P85C may have a multilayer interconnection structure including a plurality of lower conductive patterns M252, M262, B272 and M574 and a plurality of contact plugs C254, C264, and C274.

The memory cell interconnection unit C60 and the peripheral circuit interconnection unit P85C may be bonded to each other. In the first region A1, the plurality of conductive bonding structures BS may be disposed along the boundary 410 between the memory cell interconnection unit C60 and the peripheral circuit interconnection unit P85C, which are bonded to each other.

In the second region A2, the through electrode THV5 may extend to the peripheral circuit interconnection unit P85C in the vertical direction (the Z direction), through the insulating layer 430 and the memory cell insulation unit C70. The through electrode THV5 may extend to the lower conductive pattern M574 included in the peripheral circuit interconnection unit P85C. One end of the through electrode THV5 may be in contact with the lower conductive pattern M574.

The lower conductive pattern M574 and the lower conductive pattern B272 constituting the plurality of conductive bonding structures BS may be formed at the same level. The shortest distance from the main surface SM of the peripheral circuit board SUB to the lower conductive pattern B272 may be approximately the same as or similar to the shortest distance from the main surface SM to the lower conductive pattern M574.

The lower conductive pattern M574 and the lower conductive pattern B272 may include the same metal. In example embodiments, the lower conductive pattern M574 and the lower conductive pattern B272 may include Cu, respectively. The lower conductive pattern M574 and the lower conductive pattern B272 may have different cross-sectional shapes in the vertical direction (the Z direction). In example embodiments, the lower conductive pattern M574 may have the cross-sectional shape in which the width in the horizontal direction along the X-Y plane decreases as it becomes closer to the memory structure M4A, and the lower conductive pattern B272 may have the cross-sectional shape in which the width in the horizontal direction along the X-Y plane increases as it becomes closer to the memory structure M4A.

Figure 13:
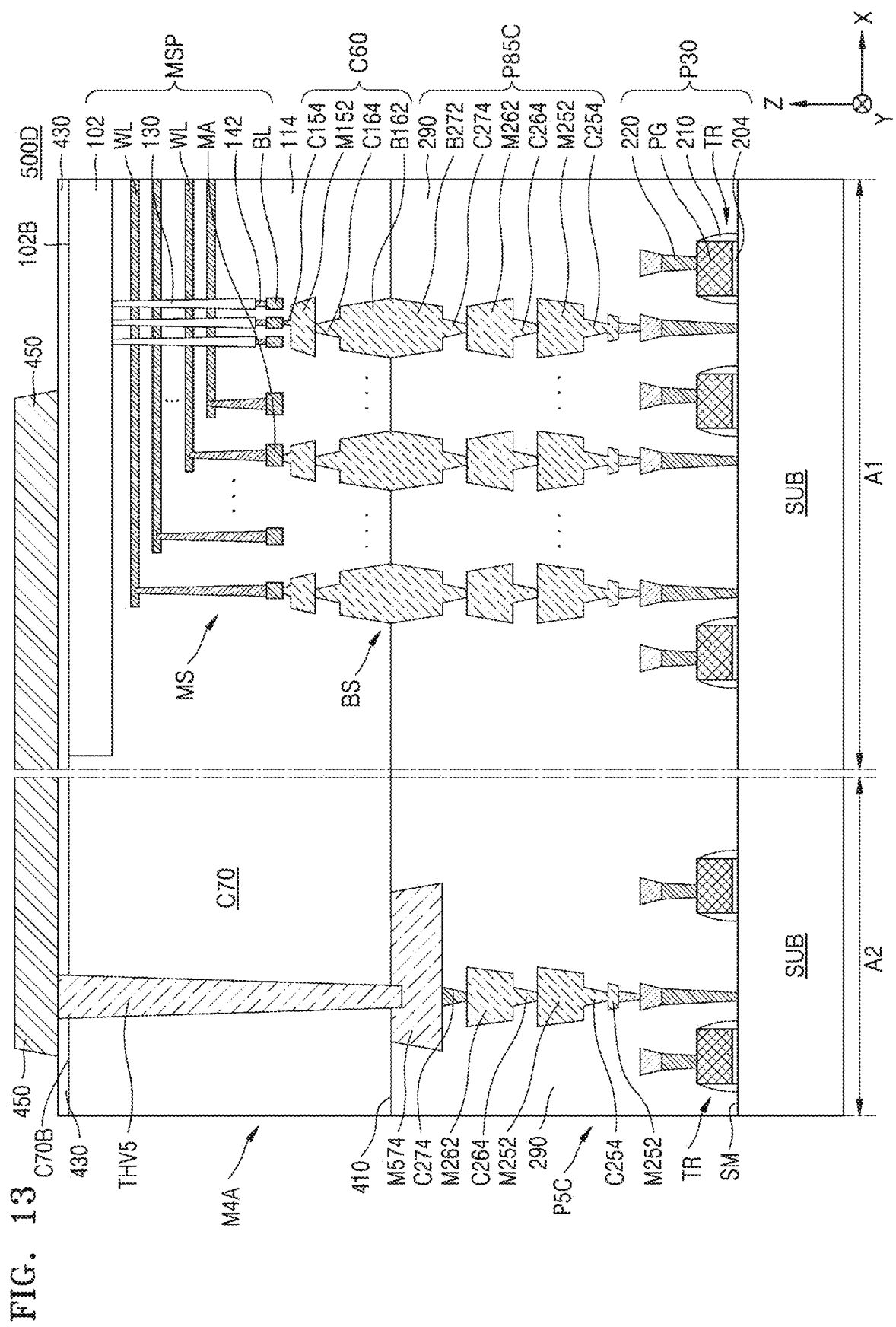

FIG. 13 is a cross-sectional view illustrating an integrated circuit device 500D according to example embodiments of the inventive concepts.

Referring to FIG. 13, the integrated circuit device 500D may have substantially the same configuration as the integrated circuit device 500C described with reference to FIG. 12. However, the integrated circuit device 500D may include the conductive pad 450 formed on the insulating film 430. The conductive pad 450 may include a portion overlapping the memory stack MS in the vertical direction (the Z direction).

The integrated circuit devices 400A, 400B, 400C, 400D, 500A, 500B, 500C, and 500D illustrated in FIGS. 6 to 13 may be a portion of the integrated circuit device 300A illustrated in FIG. 5A or the integrated circuit device 300B illustrated in FIG. 5B, respectively.

FIG. 14A is an exploded plan view illustrating some components of an integrated circuit device 600A according to example embodiments of the inventive concepts. The integrated circuit device 600A may have substantially the same configuration as the integrated circuit device 200 illustrated in FIG. 3. The integrated circuit device 600A may include a plurality of through electrodes TSV penetrating only the peripheral circuit structure PST without penetrating the memory structure MST. The plurality of through electrodes TSV may extend in the vertical direction (the Z direction) to completely penetrate the peripheral circuit board SUB and the peripheral circuit region P30 of the peripheral circuit structure PST and partially penetrate the peripheral circuit interconnection unit P80. However, the plurality of through electrodes TSV may be disposed to surround four sides of the peripheral circuit structure PST. A plurality of through electrodes TSV1, which is a portion of the plurality of through electrodes TSV, may be arranged in a line in the extension direction (the Y direction) of the plurality of bit lines BL included in the memory stack unit MSP. A plurality of through electrodes TSV2, which is another portion of the plurality of through electrodes TSV, may be arranged in a line in the width direction (the X direction) of the plurality of bit lines BL included in the memory stack unit MSP. More detailed configurations of the plurality of through electrodes TSV may be substantially the same as those described with reference to FIG. 3.

Figure 14B:
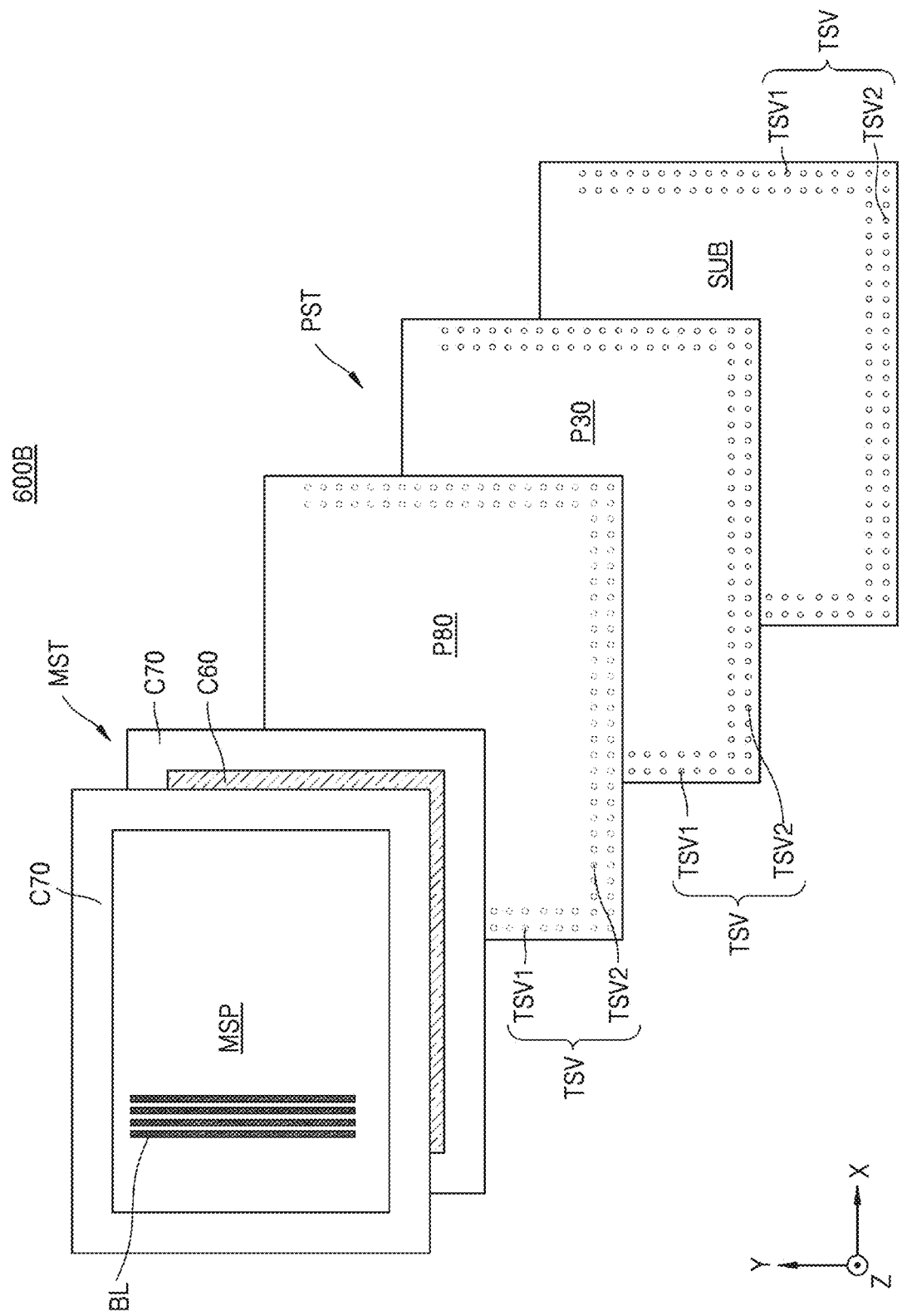

FIG. 14B is an exploded plan view illustrating some components of an integrated circuit device 600B according to example embodiments of the inventive concepts. The integrated circuit device 600B may have substantially the same configuration as the integrated circuit device 600A illustrated in FIG. 14A. However, in the integrated circuit device 600B, the plurality of through electrodes TSV may be disposed to surround three sides of the peripheral circuit structure PST.

FIGS. 14A and 14B illustrate a configuration in which a plurality of through electrodes TSV are disposed to surround at least three sides of the peripheral circuit structure PST, but the inventive concepts are not limited to example embodiments illustrated in FIGS. 14A and 14B. For example, the plurality of through electrodes TSV may be arranged to surround one side or two sides of the peripheral circuit structure PST.

Figure 15:
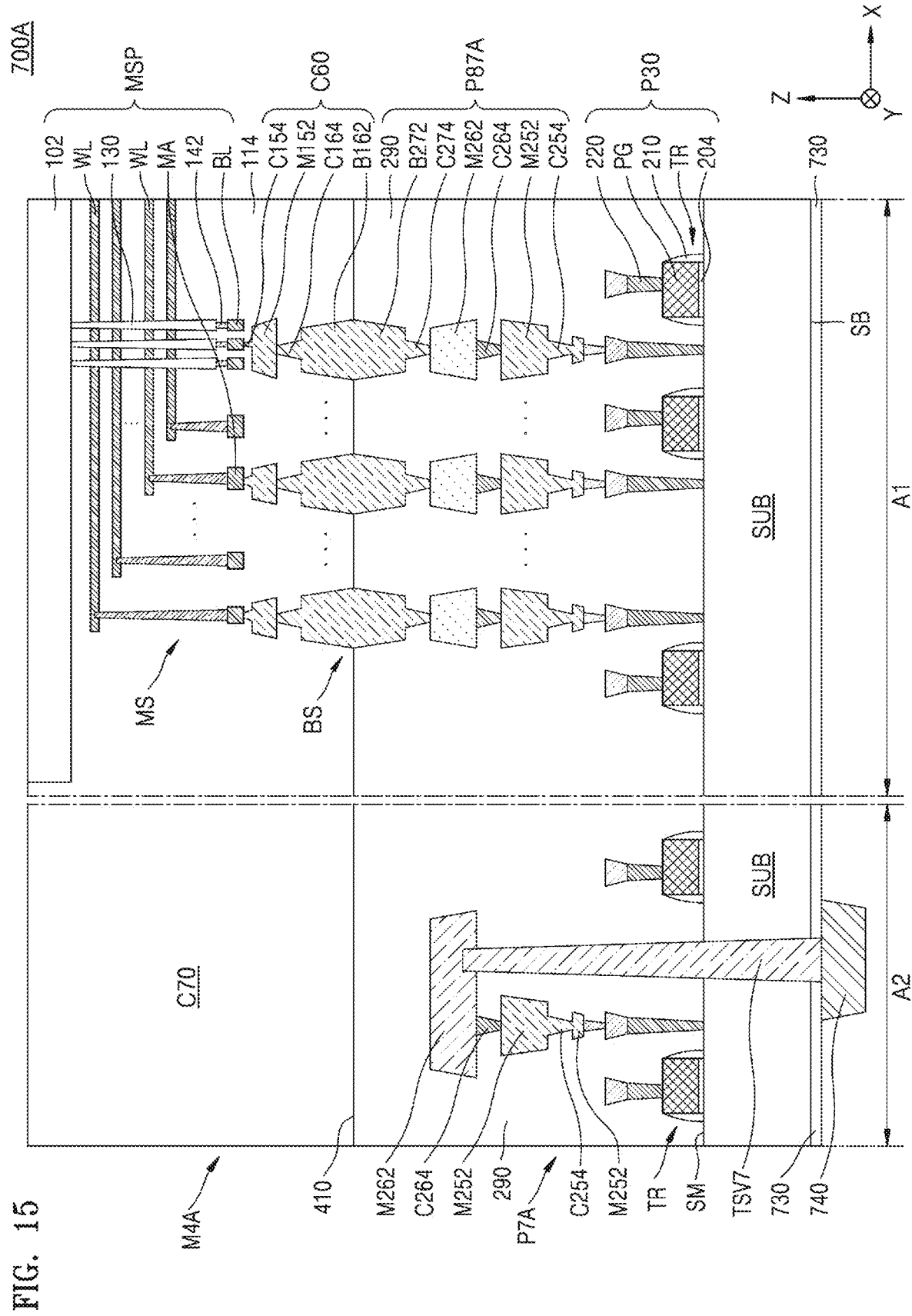
FIGS. 15 to 18 are cross-sectional views illustrating an integrated circuit devices according to example embodiments of the inventive concepts.

FIG. 15 is a cross-sectional view illustrating an integrated circuit device 700A according to example embodiments of the inventive concepts.

Referring to FIG. 15, the integrated circuit device 700A may have substantially the same configuration as the integrated circuit device 400A described with reference to FIG. 6. However, the integrated circuit device 700A may include an insulating film 730 covering a back surface SB of the peripheral circuit board SUB. A conductive pad 740 may be formed on the insulating film 730. The conductive pad 740 may be spaced apart from the peripheral circuit board SUB with the insulating layer 730 therebetween.

In the integrated circuit device 700A, the peripheral circuit interconnection unit P87A of the peripheral circuit structure P7A may include a multilayer interconnection structure including the plurality of lower conductive patterns M252, M262, and B272 and the plurality of contact plugs C254, C264, C274. A through electrode TSV7 may be arranged in the second region A2, in which the through electrode TSV7 extends to the peripheral circuit interconnection unit P87A through the insulating film 730, the peripheral circuit board SUB, and the peripheral circuit area P30 in the vertical direction (the Z direction). The through electrode THV7 may extend to the lower conductive pattern M262 included in the peripheral circuit interconnection unit P87A. One end of the through electrode THV7 may be in contact with the lower conductive pattern M262, and the other end of the through electrode THV7 may be in contact with the conductive pad 740.

More detailed configurations with respect to the insulating film 730, the conductive pad 740, and the through electrode TSV7 may be generally the same as those described with respect to the insulating film 430, the conductive pad 440, and the through electrode THV4 with reference to FIG. 6.

Although one through electrode TSV7 is illustrated in the second region A2 in FIG. 15, the integrated circuit device 700A may include a plurality of through electrodes TSV7 in the second region A2, which extend to the peripheral circuit interconnection unit P87A through the insulating film 730, the peripheral circuit board SUB, and the peripheral circuit region P30 in the vertical direction (the Z direction). As described with respect to the plurality of through electrodes THV with reference to FIG. 14A or 14B, the plurality of through electrodes THV7 may include the plurality of through electrodes THV1 arranged in a line in the extension direction (the Y direction) of the plurality of bit lines BL and the plurality of through electrodes THV2 arranged in a line in the width direction (the X direction) of the plurality of bit lines BL.

The lower conductive pattern M262 contacting one end of the through electrode TSV7 and the lower conductive pattern B272 constituting the plurality of conductive bonding structures BS may be formed at different levels, and may include different metals. In addition, the lower conductive pattern M262 may have the cross-sectional shape in which the width in the horizontal direction along the X-Y plane decreases as the lower conductive pattern M262 becomes closer toward the memory structure M4A, and the lower conductive pattern B272 may have the cross-sectional shape in which the width in the horizontal direction along the X-Y plane increases as the lower conductive pattern B272 becomes closer toward the memory structure M4A.

The conductive bonding structure BS may not exist in an electrical connection path between the through electrode THV7 and the peripheral circuits in the peripheral circuit region P30. Thus, the increase in resistance due to the conductive bonding structure BS in the electrical connection path between the through electrode THV7 and the peripheral circuits in the peripheral circuit region P30 may be reduced or prevented.

In addition, since the through electrode TSV7 may be configured to penetrate only the peripheral circuit structure P7A without penetrating the memory structure M4A, even if the stacked number of word lines WL are increased in order to improve the degree of integration in the memory stack MS and the number of contacts connected to the word lines WL and the number of interconnections are increased, a vertical length of the through electrode TSV7 may be kept constant regardless of the increase in height in the vertical direction of the memory stack MS. Accordingly, even if the stacked number of word lines WL are increased to increase the vertical height of the memory stack MS, a resistance value may be kept constant in an electrical connection path connected to the outside from a circuit used to input/output data, an address, or a command, or a circuit sensitive to resistance.

Figure 16:
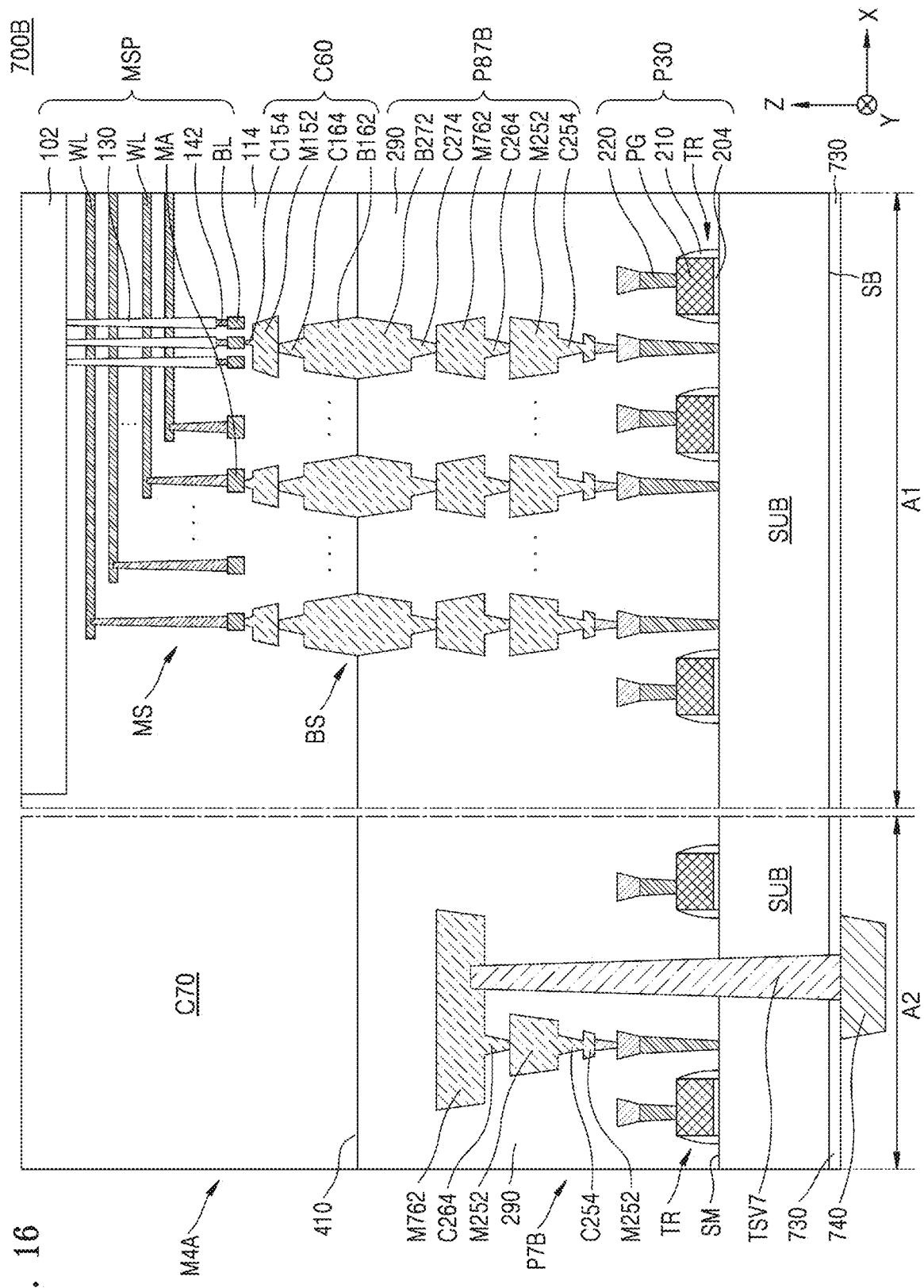

FIG. 16 is a cross-sectional view illustrating an integrated circuit device 700B according to example embodiments of the inventive concepts.

Referring to FIG. 16, the integrated circuit device 700B may have substantially the same configuration as the integrated circuit device 700A described with reference to FIG. 15. In the integrated circuit device 700B, the peripheral circuit interconnection unit P87B of the peripheral circuit structure P7B may include a multilayer interconnection structure including the plurality of lower conductive patterns M252, M762, and B272 and the plurality of contact plugs C254, C264, C274.

The memory cell interconnection unit C60 and the peripheral circuit interconnection unit P87B may be bonded to each other. In the first region A1, the plurality of conductive bonding structures BS may be disposed along the boundary 410 between the memory cell interconnection unit C60 and the peripheral circuit interconnection unit P87B, which are bonded to each other. One end of the through electrode TSV7 may contact the lower conductive pattern M762 in the second region A2.

The lower conductive pattern M762 contacting one end of the through electrode THV7 and the lower conductive pattern B272 constituting the plurality of conductive bonding structures BS may be formed at different levels. The lower conductive pattern M762 and the lower conductive pattern B272 may include the same metal. The lower conductive pattern M762 and the lower conductive pattern B272 may have the cross-sectional shape in which the width in the horizontal direction along the X-Y plane increases as they become closer to the memory structure M4A, respectively.

Figure 17:
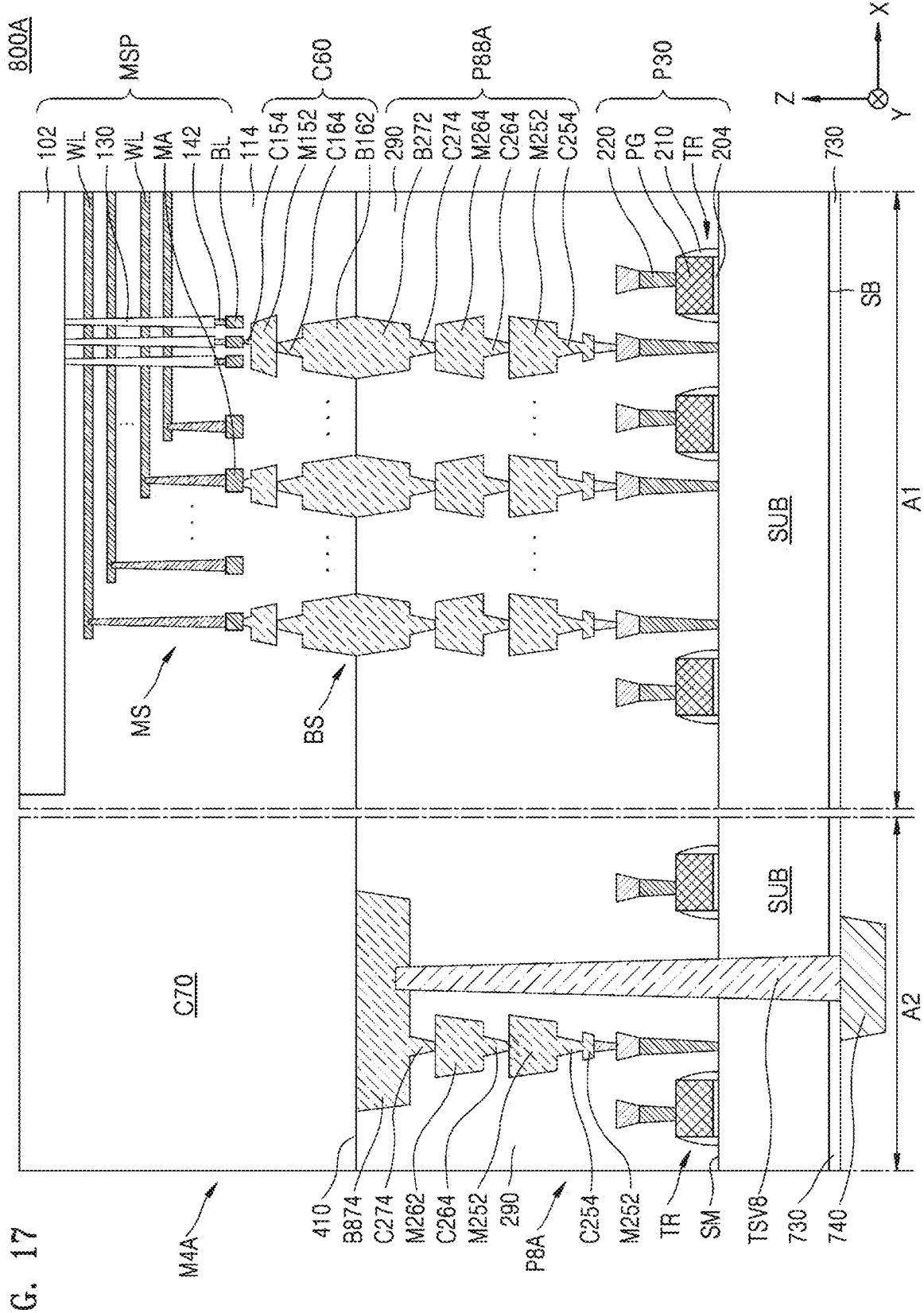

FIG. 17 is a cross-sectional view illustrating an integrated circuit device 800A according to example embodiments of the inventive concepts.

Referring to FIG. 17, the integrated circuit device 800A may have substantially the same configuration as the integrated circuit device 700A described with reference to FIG. 15. However, the peripheral circuit interconnection unit P88A of the peripheral circuit structure P8A in the integrated circuit device 800A may include a multilayer interconnection structure including a plurality of lower conductive patterns M252, M262, M264, B272, and B874 and a plurality of contact plugs C254, C264, and C274.

The memory cell interconnection unit C60 and the peripheral circuit interconnection unit P88A may be bonded to each other. In the first region A1, the plurality of conductive bonding structures BS may be disposed along the boundary 410 between the memory cell interconnection unit C60 and the peripheral circuit interconnection unit P88A, which are bonded to each other.

In the second region A2, a through electrode TSV8 may extend in the vertical direction (the Z direction) to the peripheral circuit interconnection unit P88A through the insulating film 730, the peripheral circuit board SUB, and the peripheral circuit region P30. One end of the through electrode THV8 may be in contact with the lower conductive pattern B874. More detailed configuration with respect to the through electrode THV8 may be substantially the same as that described with respect to the through electrode THV4 with reference to FIG. 6.

The lower conductive pattern B874 and the lower conductive pattern B272 may be formed at the same level. The lower conductive pattern B874 and the lower conductive pattern B272 may include the same metal. The lower conductive pattern B874 and the lower conductive pattern B272 may have the cross-sectional shape in which the width in the horizontal direction along the X-Y plane increases as they become closer to the memory structure M4A, respectively.

The conductive bonding structure BS may not exist in an electrical connection path between the through electrode THV8 and the peripheral circuits in the peripheral circuit region P30. Thus, an increase in resistance due to the conductive bonding structure BS in the electrical connection path between the through electrode THV8 and the peripheral circuits in the peripheral circuit region P30 may be reduced or prevented.

In addition, since the through electrode TSV8 may be configured to penetrate only the peripheral circuit structure P8A without penetrating the memory structure M4A, even if the stacked number of word lines WL are increased in order to improve the degree of integration in the memory stack MS and the number of contacts connected to the word lines WL and the number of interconnections are increased, a vertical length of the through electrode TSV8 may be kept constant regardless of the increase in height in the vertical direction of the memory stack MS. Accordingly, even if the stacked number of word lines WL are increased to increase the vertical height of the memory stack MS, a resistance value may be kept constant in an electrical connection path connected to the outside from a circuit used to input/output data, an address, or a command, or a circuit sensitive to resistance.

Figure 18:
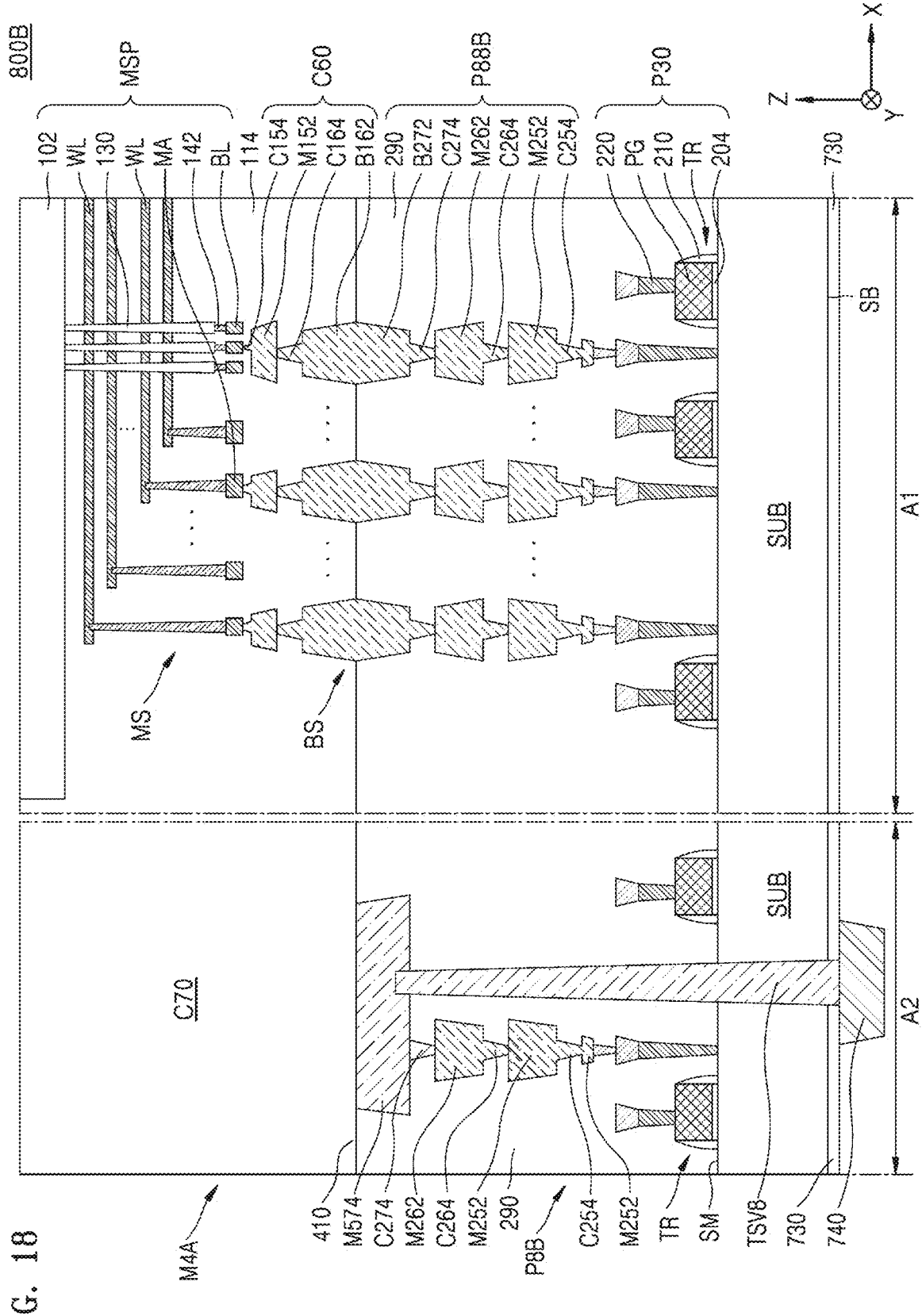

FIG. 18 is a cross-sectional view illustrating an integrated circuit device 800B according to example embodiments of the inventive concepts.

Referring to FIG. 18, the integrated circuit device 800B may have substantially the same configuration as the integrated circuit device 800A described with reference to FIG. 17. However, the peripheral circuit interconnection unit P88B of the peripheral circuit structure P8B in the integrated circuit device 800B may include a multilayer interconnection structure including a plurality of lower conductive patterns M252, M262, B272, and M574 and a plurality of contact plugs C254, C264, and C274.

The memory cell interconnection unit C60 and the peripheral circuit interconnection unit P88B may be bonded to each other. In the first region A1, the plurality of conductive bonding structures BS may be disposed along the boundary 410 between the memory cell interconnection unit C60 and the peripheral circuit interconnection unit P88B, which are bonded to each other.

One end of the through electrode TSV8 may contact the lower conductive pattern M574 in the second region A2. A detailed description of the lower conductive pattern M574 may be as described with reference to FIG. 12.

The integrated circuit devices 700A, 700B, 800A, and 800B described with reference to FIGS. 15 to 18 may respectively constitute a portion of the integrated circuit device 600A illustrated in FIG. 14A or the integrated circuit device 600B illustrated in FIG. 14B.

FIGS. 19A to 19D are cross-sectional views illustrating a manufacturing method of an integrated circuit device according to example embodiments of the inventive concepts. A method of manufacturing the integrated circuit device 400A illustrated in FIG. 6 will be described with reference to FIGS. 19A to 19D.

Figure 19A:
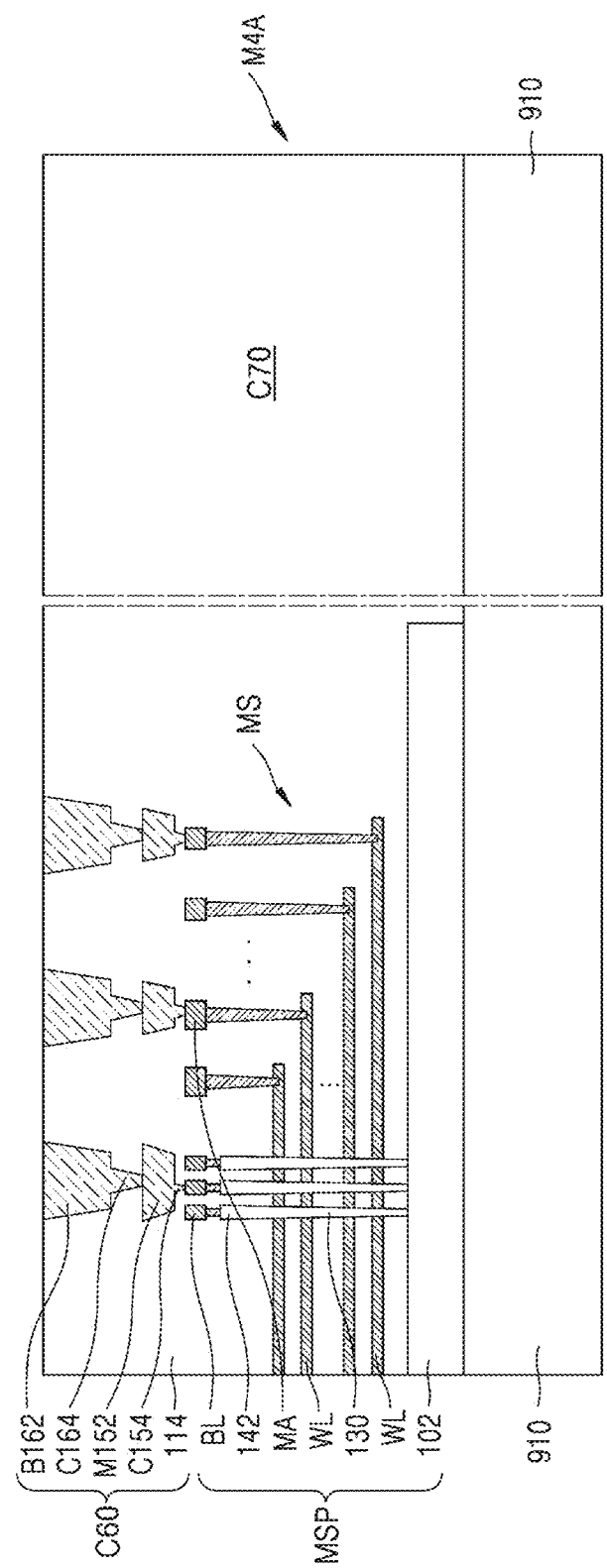
FIGS. 19A to 19D are cross-sectional views illustrating a method of manufacturing an integrated circuit device in the order of process, according to example embodiments of the inventive concepts.

Referring to FIG. 19A, the memory structure M4A including the memory stack unit MSP, the memory cell interconnection unit C60, and a memory cell insulation unit C70 may be formed on a substrate 910.

The substrate 910 may include silicon. In example embodiments, the semiconductor layer 102 may include polysilicon formed by a deposition process on the substrate 910. In other example embodiments, the semiconductor layer 102 may include a silicon film integrally formed with the substrate 910.

Figure 19B:
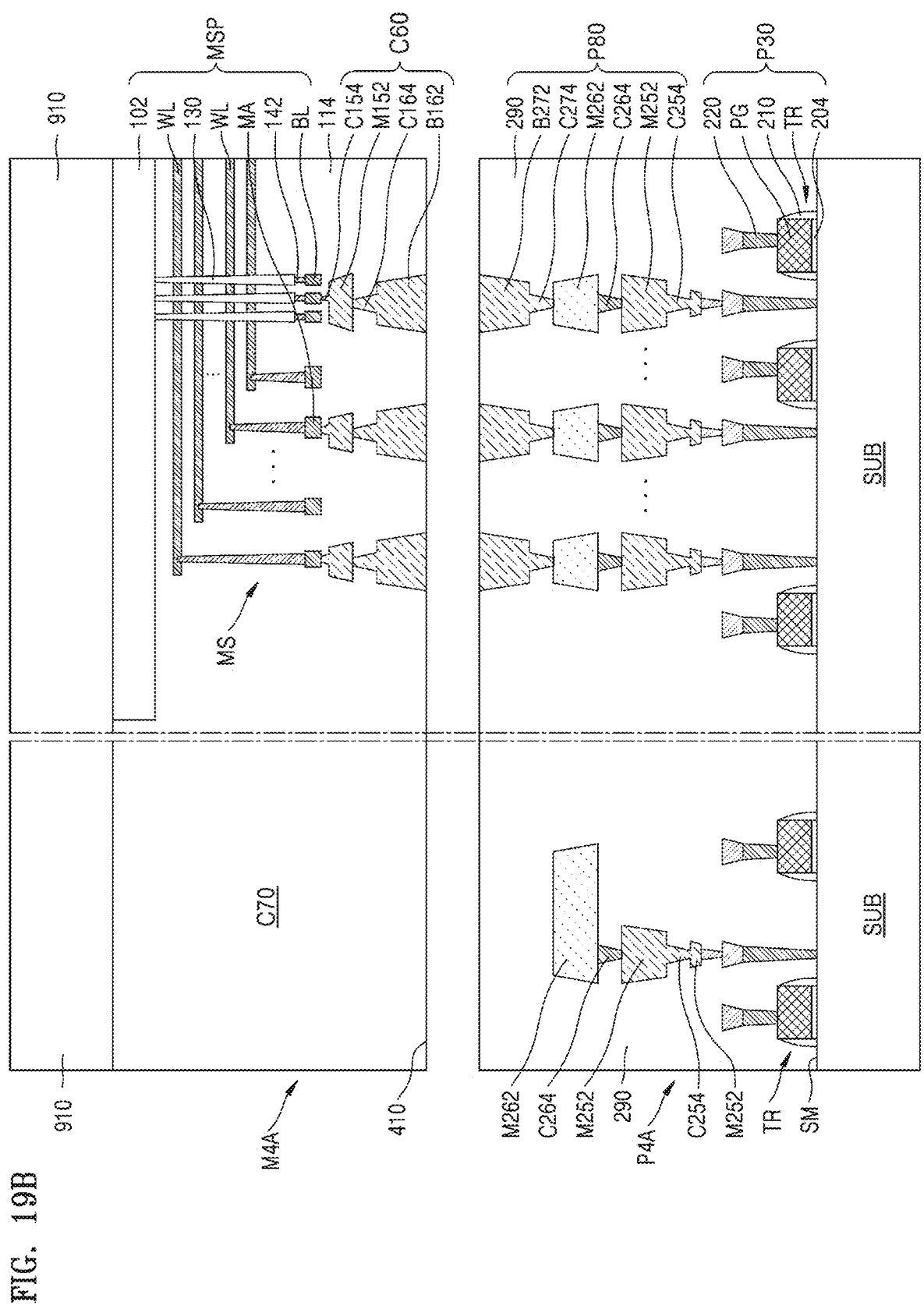

Referring to FIG. 19B, after forming the peripheral circuit structure P4A in which the peripheral circuit region P30 and the peripheral circuit interconnection unit P80 are stacked on the peripheral circuit board SUB, the peripheral circuit board SUB and the substrate 910 may be aligned such that the circuit interconnection unit P80 face the memory cell interconnection unit C60 and the memory cell insulation unit C70 of the memory structure M4A to each other.

Figure 19C:
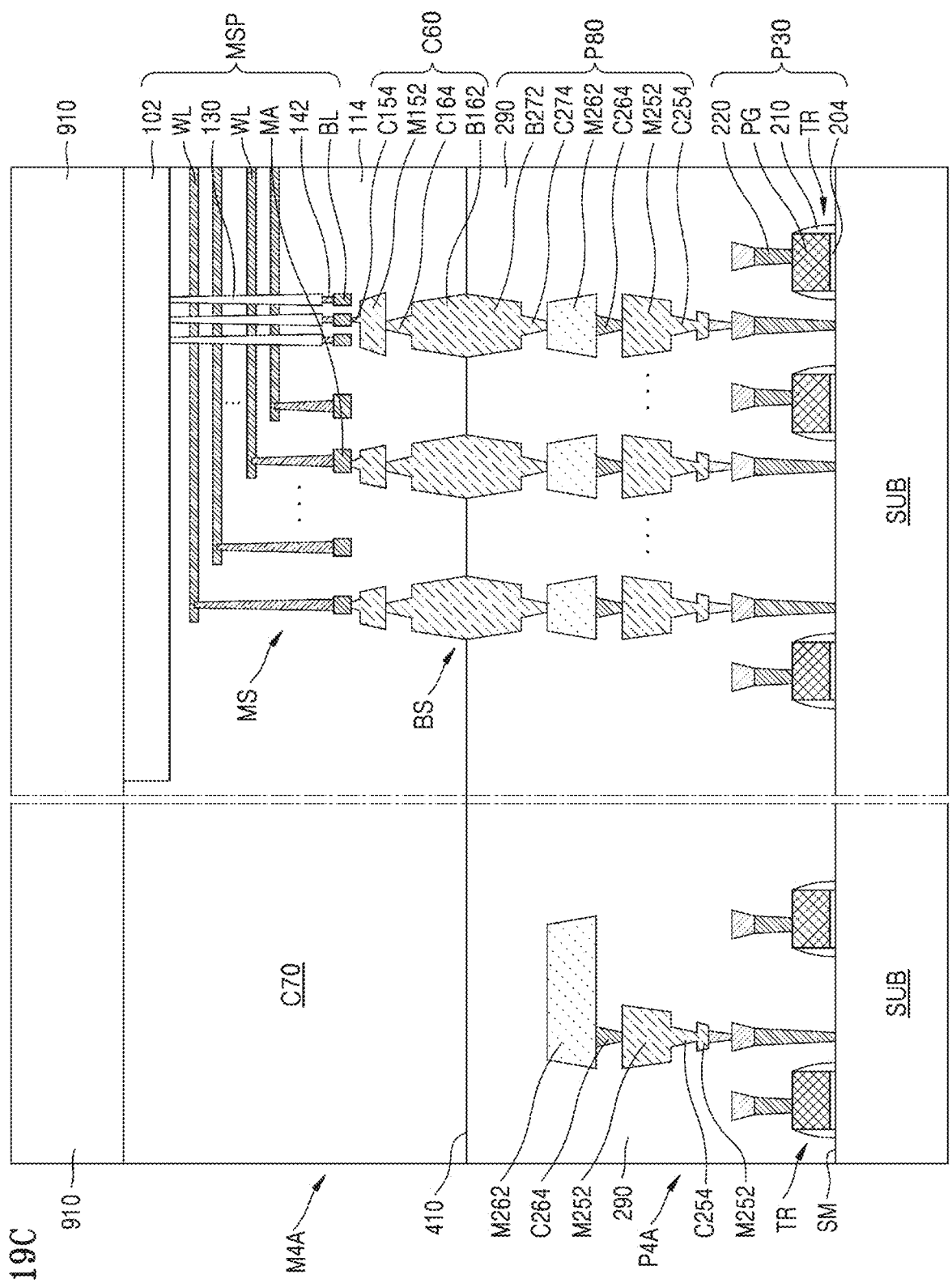

Referring to FIG. 19C, the plurality of conductive bonding structures BS may be formed by performing the bonding process between the memory cell interconnection unit C60 and the memory cell insulation unit C70, and the peripheral circuit interconnection unit P80.

In some example embodiments, the memory cell interconnection unit C60 and the memory cell insulation unit C70, and the peripheral circuit interconnection unit P80 may be brought into contact with each other in a state of facing each other, and then subjected to heat treatment under pressure. The heat treatment may be performed at a temperature of about 180° C. to about 300° C. The conductive bonding structure BS may be formed by being integrally coupled without a boundary between the upper conductive pattern B162 and the lower conductive pattern B272 which are in contact with each other, while metals constituting each of the upper conductive pattern B162 and the lower conductive pattern B272 that are in contact with each other reflow by heat treatment during the bonding process.

Figure 19D:
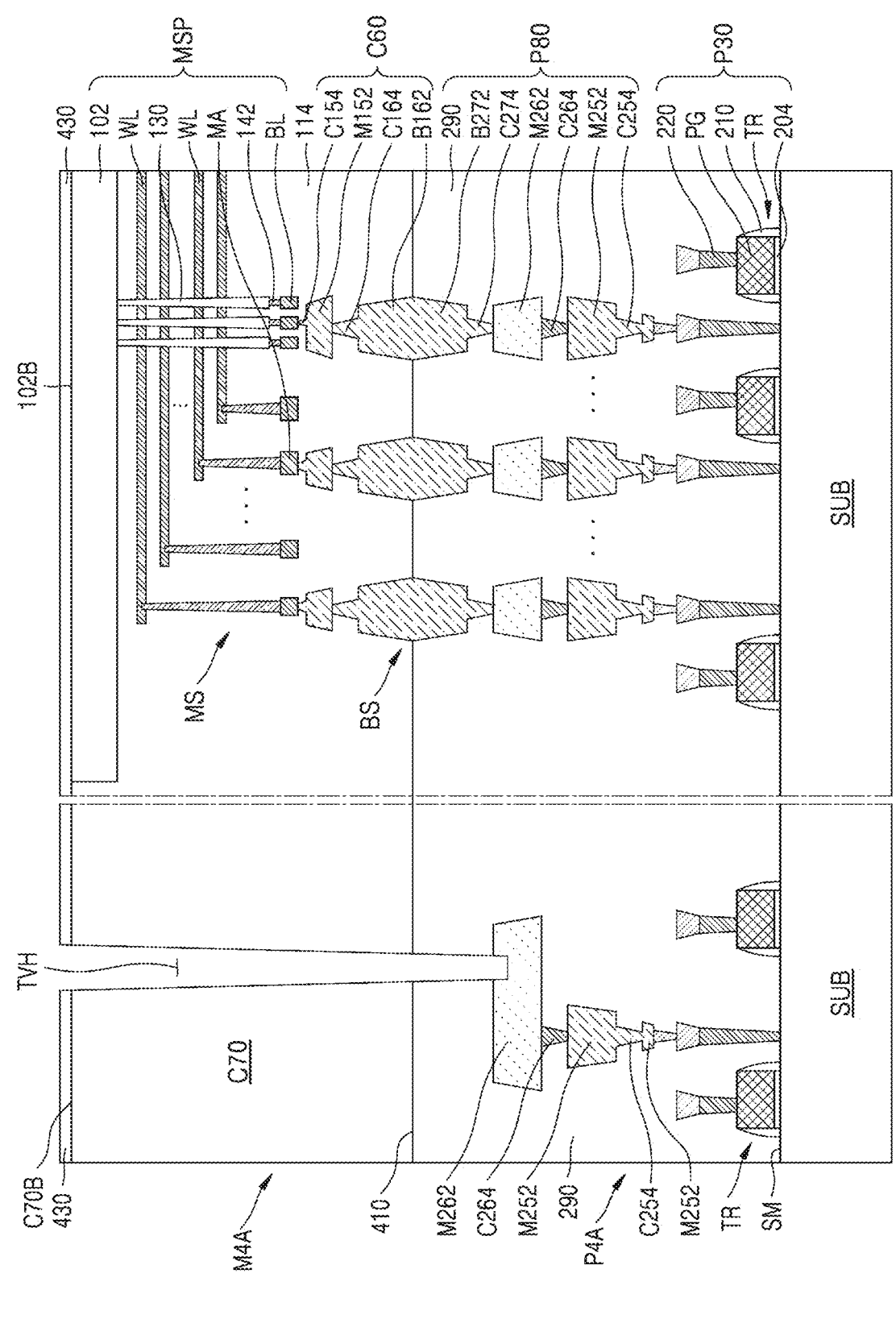

Referring to FIG. 19D, the substrate 910 may be removed from the resultant of FIG. 19C by grinding to expose the semiconductor layer 102 and the memory cell insulation unit C70, and then the insulating film 430 may be formed to cover a back surface 102B of the semiconductor layer 102 and a back surface C70B of the memory cell insulation unit C70. Thereafter, in the second region A2, the through hole TVH may be formed to penetrate the insulating layer 430, the memory cell insulation unit C70, and a portion of the interlayer insulating film 290 and to expose the lower conductive pattern M262.

Thereafter, the through electrode THV4 filling the through hole TVH may be formed, and then the conductive pad 440 may be formed on the insulating film 430 to manufacture the integrated circuit device 400A illustrated in FIG. 6.

Figure 20A:
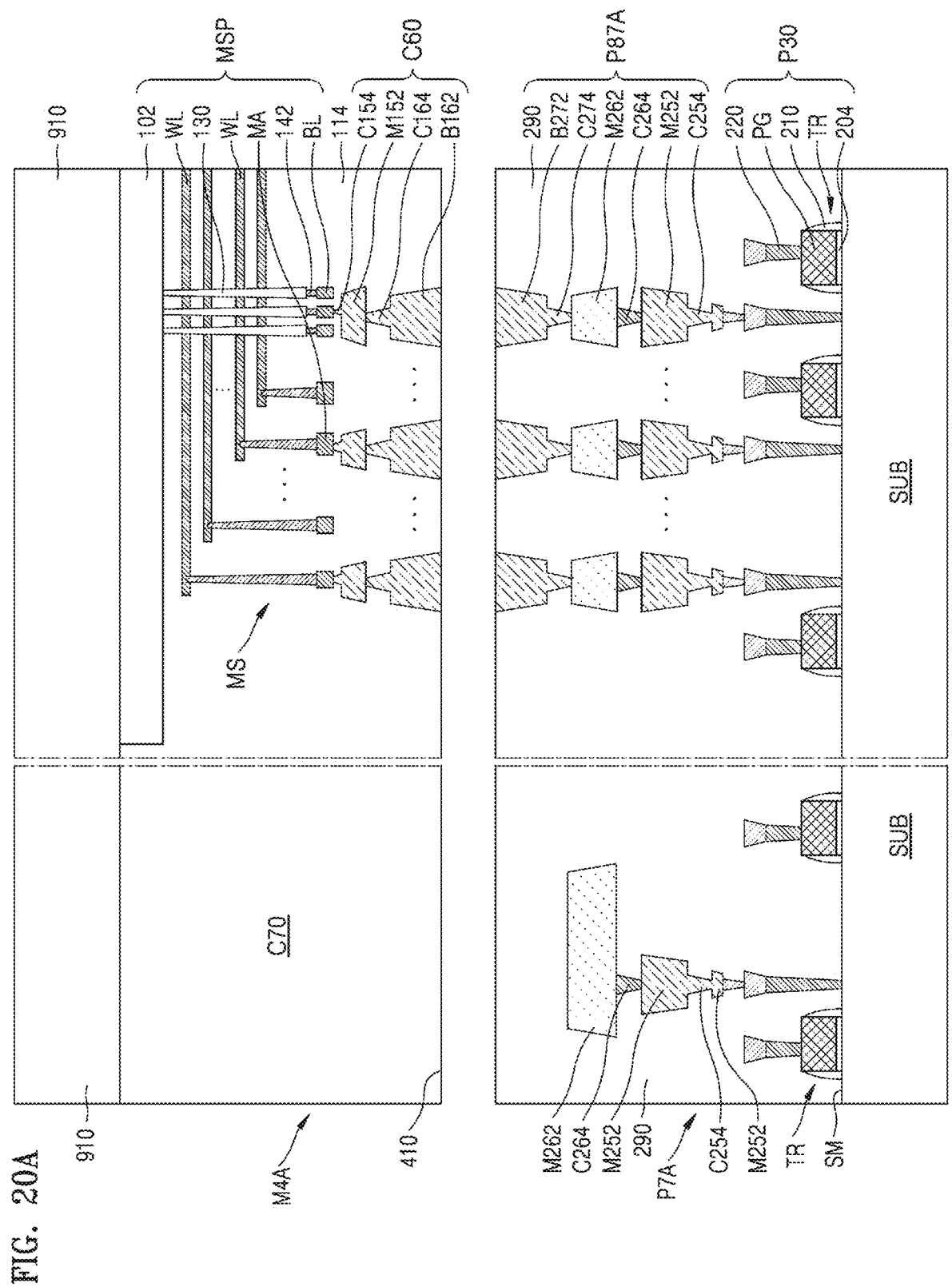
FIGS. 20A to 20C are cross-sectional views illustrating a method of manufacturing an integrated circuit device in the order of process, according to example embodiments of the inventive concepts.
Figure 20B:
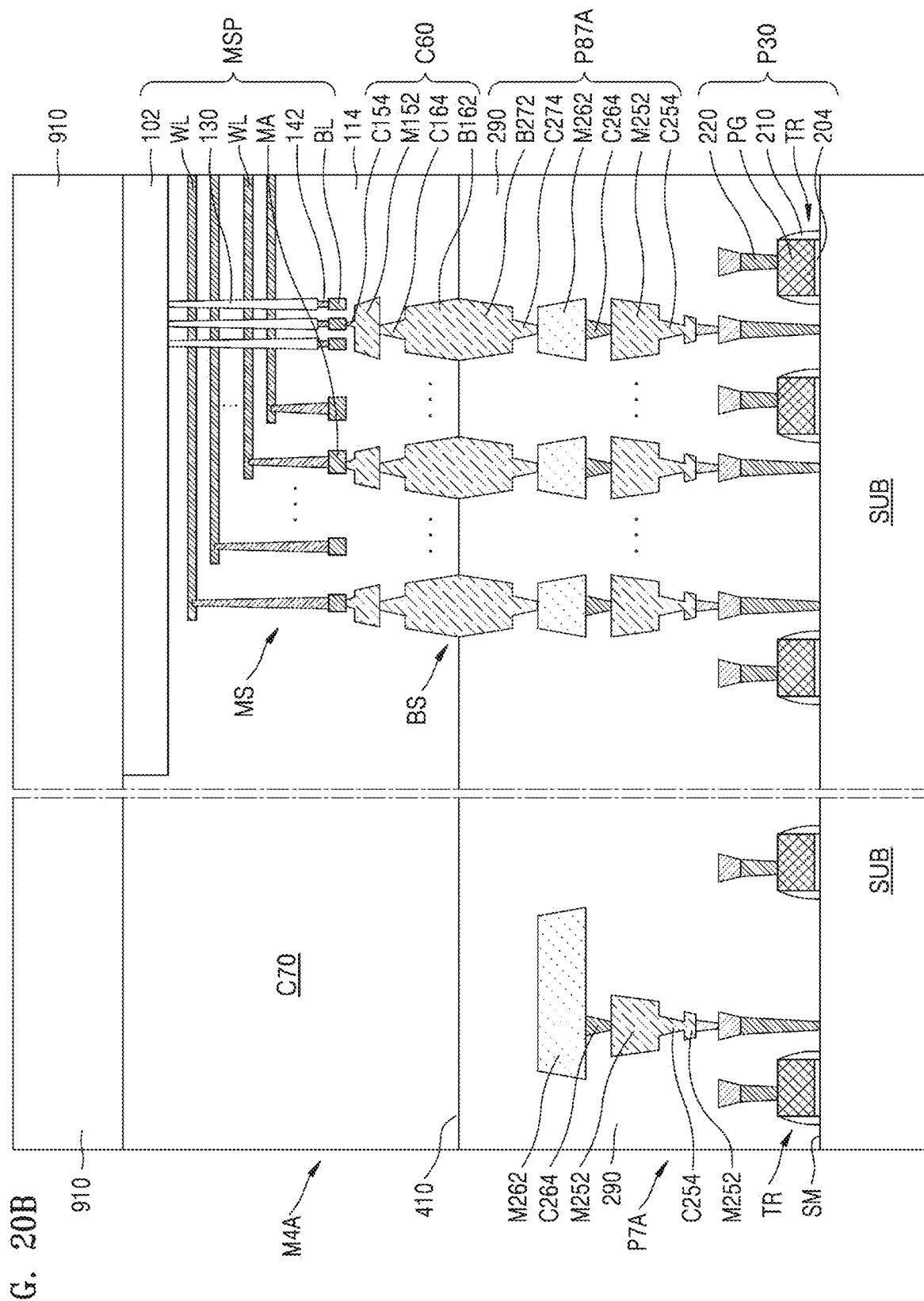
Figure 20C:
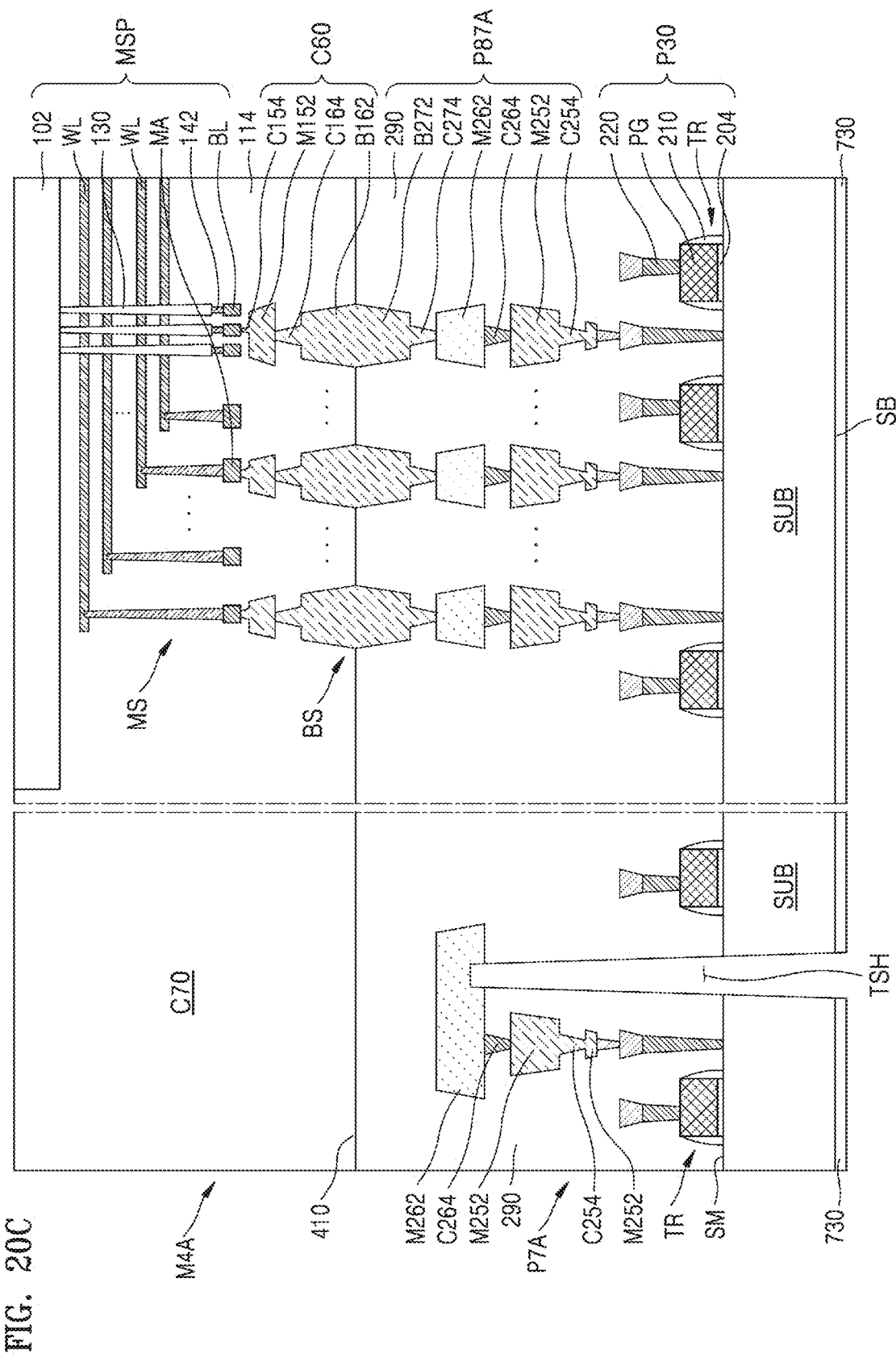

FIGS. 20A to 20C are cross-sectional views illustrating a method of manufacturing an integrated circuit device in the order of process, according to other example embodiments of the inventive concepts. The method of manufacturing the integrated circuit device 700A illustrated in FIG. 15 will be described with reference to FIGS. 20A to 20C.

Referring to FIG. 20A, after forming the memory structure M4A on the substrate 910 by the same method as that described with reference to FIG. 19A, the peripheral circuit structure P7A stacked with the peripheral circuit region P30 and the peripheral circuit interconnection unit P87A may be formed on the peripheral circuit board SUB in a similar manner as that described with reference to FIG. 19B, and then the peripheral circuit board SUB and the substrate 910 may be aligned such that the peripheral circuit interconnection unit P87A of the peripheral circuit structure P7A face the interconnection unit C60 and the memory cell insulation unit C70 to each other.

Referring to FIG. 20B, the bonding process between the memory cell interconnection unit C60 and the memory cell insulation unit C70, and the peripheral circuit interconnection unit P87A may be performed by a method similar to that described with reference to FIG. 19C.

Referring to FIG. 20C, thereafter, the substrate 910 may be removed from the resultant of FIG. 20B by grinding, the insulating film 730 may be formed to cover the back surface SB of the peripheral circuit board SUB, and the through hole TSH may be formed to penetrate the insulating film 730, the peripheral circuit board SUB, and the peripheral circuit region P30 and to expose the lower conductive pattern M262 included in the peripheral circuit interconnection unit P87A in the second region A2.

Thereafter, the through electrode TSV7 filling the through hole TSH may be formed, and then the conductive pad 740 may be formed on the insulating film 730 to manufacture the integrated circuit device 700A illustrated in FIG. 15.

Even though methods of manufacturing the integrated circuit device 400A illustrated in FIG. 6 and the integrated circuit device 700A illustrated in FIG. 15 has been described with reference to FIGS. 19A to 19D and 20A to 20C, those skilled in the art will appreciate that the integrated circuit devices illustrated in FIGS. 2, 3, 5A, 5B, 7 to 13, 14A, 14B, and 16 to 18, and various integrated circuit devices having a structure similar thereto may be manufactured by applying various modifications and changes within the scope of inventive concept, from those described with reference to FIGS. 19A to 19D and 20A to 20C.

Figure 21:
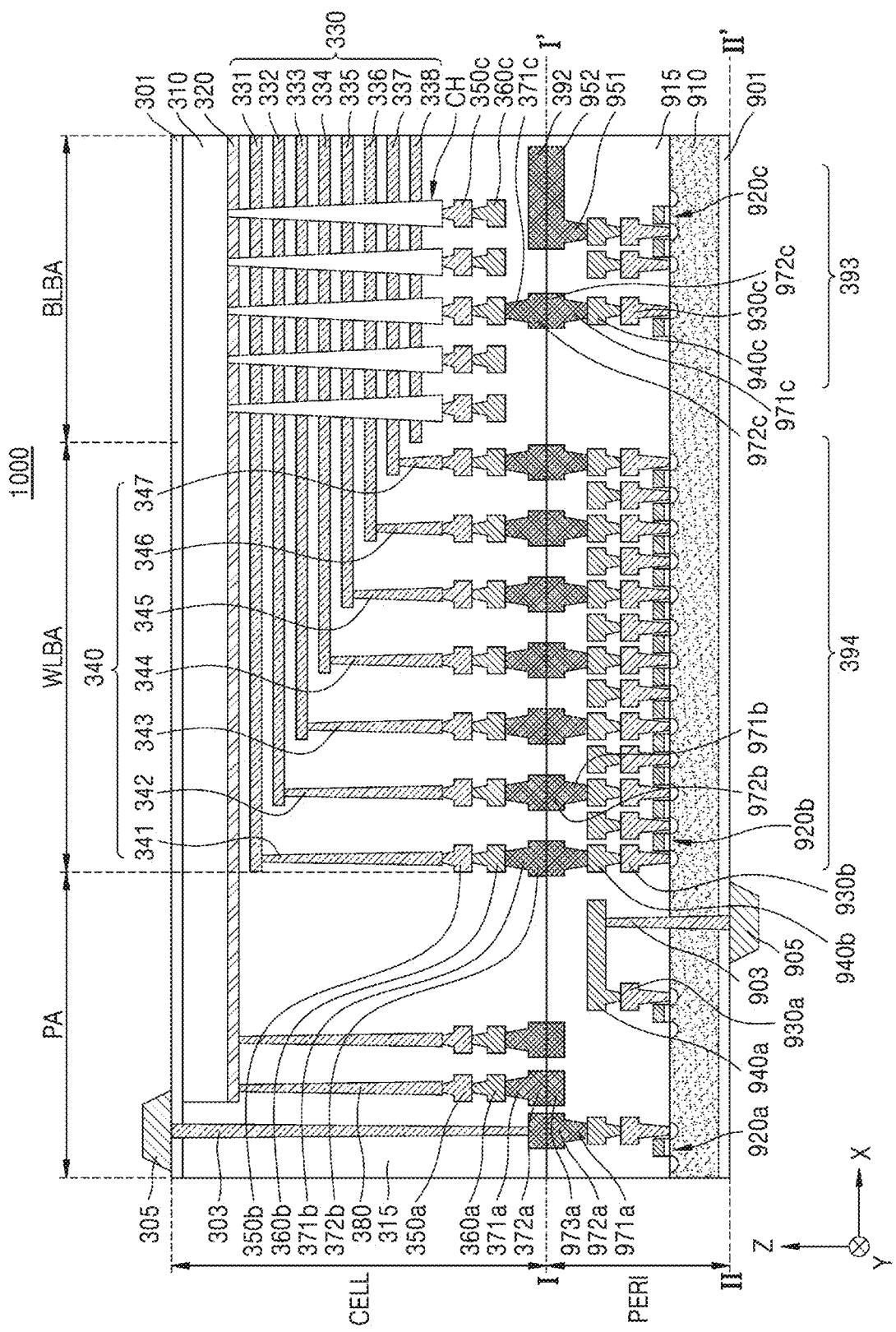
FIG. 21 illustrates a memory device having a chip-to-chip (C2C) structure, according to example embodiments of the inventive concepts.

FIG. 21 illustrates a memory device having a chip-to-chip (C2C) structure, according to example embodiments of the inventive concepts.

Referring to FIG. 21, a memory device 1000 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the memory device 1000 may include an external pad bonding area PA, a word line bonding area WLBA, and a bit line bonding area BLBA.

The peripheral circuit region PERI may include a first substrate 910, an interlayer insulating layer 915, a plurality of circuit elements 920a, 920b, and 920c formed on the first substrate 910, first metal layers 930a, 930b, and 930c respectively connected to the plurality of circuit elements 920a, 920b, and 920c, and second metal layers 940a, 940b, and 940c formed on the first metal layers 930a, 930b, and 930c. In an example embodiment, the first metal layers 930a, 930b, and 930c may be formed of tungsten having relatively high resistance, and the second metal layers 940a, 940b, and 940c may be formed of copper having relatively low resistance.

In an example embodiment illustrate in FIG. 21, although the first metal layers 930a, 930b, and 930c and the second metal layers 940a, 940b, and 940c are shown and described, they are not limited thereto, and one or more metal layers may be further formed on the second metal layers 940a, 940b, and 940c. At least a portion of the one or more metal layers formed on the second metal layers 940a, 940b, and 940c may be formed of aluminum or the like having a lower resistance than those of copper forming the second metal layers 940a, 940b, and 940c.

The interlayer insulating layer 915 may be disposed on the first substrate 910 and cover the plurality of circuit elements 920a, 920b, and 920c, the first metal layers 930a, 930b, and 930c, and the second metal layers 940a, 940b, and

940c. The interlayer insulating layer 915 may include an insulating material such as silicon oxide, silicon nitride, or the like.

Lower bonding metals 971b and 972b may be formed on the second metal layer 940b in the word line bonding area WLBA. In the word line bonding area WLBA, the lower bonding metals 971b and 972b in the peripheral circuit region PERI may be electrically connected to upper bonding metals 371b and 372b in a bonding manner, and the lower bonding metals 971b and 972b and the upper bonding metals 371b and 372b may be formed of aluminum, copper, tungsten, or the like. Further, the upper bonding metals 371b and 372b in the cell region CELL may be referred as first metal pads and the lower bonding metals 971b and 972b in the peripheral circuit region PERI may be referred as second metal pads.

The cell region CELL may include at least one memory block. The cell region CELL may include a second substrate 310 and a common source line 320. On the second substrate 310, a plurality of word lines 331 to 338 (i.e., 330) may be stacked in a direction (the Z direction), perpendicular to an upper surface of the second substrate 310. At least one string select line and at least one ground select line may be arranged on and below the plurality of word lines 330, respectively, and the plurality of word lines 330 may be disposed between the at least one string select line and the at least one ground select line.

In the bit line bonding area BLBA, a channel structure CH may extend in a direction, perpendicular to the upper surface of the second substrate 310, and pass through the plurality of word lines 330, the at least one string select line, and the at least one ground select line. The channel structure CH may include a data storage layer, a channel layer, a buried insulating layer, and the like, and the channel layer may be electrically connected to a first metal layer 350c and a second metal layer 360c. For example, the first metal layer 350c may be a bit line contact, and the second metal layer 360c may be a bit line. In an example embodiment, the bit line 360c may extend in a first direction (the Y direction), parallel to the upper surface of the second substrate 310.

In an example embodiment illustrated in FIG. 21, an area in which the channel structure CH, the bit line 360c, and the like are disposed may be defined as the bit line bonding area BLBA. In the bit line bonding area BLBA, the bit line 360c may be electrically connected to the circuit elements 920c providing a page buffer 393 in the peripheral circuit region PERI. For example, the bit line 360c may be connected to upper bonding metals 371c and 372c in the cell region CELL, and the upper bonding metals 371c and 372c may be connected to lower bonding metals 971c and 972c connected to the circuit elements 920c of the page buffer 393.

In the word line bonding area WLBA, the plurality of word lines 330 may extend in a second direction (the X direction), parallel to the upper surface of the second substrate 310, and may be connected to a plurality of cell contact plugs 341 to 347 (i.e., 340). The plurality of word lines 330 and the plurality of cell contact plugs 340 may be connected to each other in pads provided by at least a portion of the plurality of word lines 330 extending in different lengths in the second direction. A first metal layer 350b and a second metal layer 360b may be connected to an upper portion of the plurality of cell contact plugs 340 connected to the plurality of word lines 330, sequentially. The plurality of cell contact plugs 340 may be connected to the peripheral circuit region PERI by the upper bonding metals 371b and 372b of the cell region CELL and the lower bonding metals 971b and 972b of the peripheral circuit region PERI in the word line bonding area WLBA.

The plurality of cell contact plugs 340 may be electrically connected to the circuit elements 920b providing a row decoder 394 in the peripheral circuit region PERI. In an example embodiment, operating voltages of the circuit elements 920b providing the row decoder 394 may be different than operating voltages of the circuit elements 920c providing the page buffer 393. For example, operating voltages of the circuit elements 920c providing the page buffer 393 may be greater than operating voltages of the circuit elements 920b providing the row decoder 394.

A common source line contact plug 380 may be disposed in the external pad bonding area PA. The common source line contact plug 380 may be formed of a conductive material such as a metal, a metal compound, polysilicon, or the like, and may be electrically connected to the common source line 320. A first metal layer 350a and a second metal layer 360a may be stacked on an upper portion of the common source line contact plug 380, sequentially. For example, an area in which the common source line contact plug 380, the first metal layer 350a, and the second metal layer 360a are disposed may be defined as the external pad bonding area PA.

Input-output pads 305 and 905 may be disposed in the external pad bonding area PA. Referring to FIG. 21, a lower insulating film 901 covering a lower surface of the first substrate 910 may be formed below the first substrate 910, and a first input-output pad 905 may be formed on the lower insulating film 901. The first input-output pad 905 may be connected to at least one of the plurality of circuit elements 920a, 920b, and 920c disposed in the peripheral circuit region PERI through a first input-output contact plug 903, and may be separated from the first substrate 910 by the lower insulating film 901. In addition, a side insulating film may be disposed between the first input-output contact plug 903 and the first substrate 910 to electrically separate the first input-output contact plug 903 and the first substrate 910.

Referring to FIG. 21, an upper insulating film 301 covering the upper surface of the second substrate 310 may be formed on the second substrate 310, and a second input-output pad 305 may be disposed on the upper insulating layer 301. The second input-output pad 305 may be connected to at least one of the plurality of circuit elements 920a, 920b, and 920c disposed in the peripheral circuit region PERI through a second input-output contact plug 303.

According to embodiments, the second substrate 310 and the common source line 320 may not be disposed in an area in which the second input-output contact plug 303 is disposed. Also, the second input-output pad 305 may not overlap the word lines 330 in the third direction (the Z direction). Referring to FIG. 21, the second input-output contact plug 303 may be separated from the second substrate 310 in a direction, parallel to the upper surface of the second substrate 310, and may pass through the interlayer insulating layer 315 of the cell region CELL to be connected to the second input-output pad 305.

According to embodiments, the first input-output pad 905 and the second input-output pad 305 may be selectively formed. For example, the memory device 1000 may include only the first input-output pad 905 disposed on the first substrate 910 or the second input-output pad 305 disposed on the second substrate 310. Alternatively, the memory device 1000 may include both the first input-output pad 905 and the second input-output pad 305.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 1000 may include lower metal patterns 971a, 972a, and 973a formed in the peripheral circuit region PERI. Each of the lower metal patterns 971a, 972a, and 973a may be connected to corresponding pattern from among upper metal patterns 371a and 372a formed in the cell region CELL. In the peripheral circuit region PERI, the lower metal pattern 973a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 971b and 972b may be formed on the second metal layer 940b in the word line bonding area WLBA. In the word line bonding area WLBA, the lower bonding metals 971b and 972b of the peripheral circuit region PERI may be electrically connected to the upper bonding metals 371b and 372b of the cell region CELL by a Cu—Cu bonding.

Further, the bit line bonding area BLBA, an upper metal pattern 392, corresponding to a lower metal pattern 952 formed in the uppermost metal layer of the peripheral circuit region PERI, and having the same shape as the lower metal pattern 952 of the peripheral circuit region PERI, may be formed in an uppermost metal layer of the cell region CELL. A contact may not be formed on the upper metal pattern 392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

While the inventive concept has been particularly shown and described with reference to embodiments thereof, it will be understood that various changes in form and details may be made therein without departing from the spirit and scope of the following claims.

What is claimed is:

1. An integrated circuit device comprising:
   a memory comprising
      a memory stack,
      a memory cell interconnection comprising a plurality of upper conductive patterns configured to be electrically connectable to the memory stack, and
      a memory cell insulation surrounding the memory stack and the memory cell interconnection;
   a peripheral circuit comprising
      a peripheral circuit board,
      a peripheral circuit region on the peripheral circuit board, and
      a peripheral circuit interconnection comprising a plurality of lower conductive patterns between the peripheral circuit region and the memory and bonded to the memory cell interconnection;
   a plurality of conductive bonding structures on a boundary between the memory cell interconnection and the peripheral circuit interconnection in a first region, the first region overlapping the memory stack in a vertical direction, the plurality of conductive bonding structures being bonded plurality of first upper conductive patterns selected from among the plurality of upper conductive patterns and a respective plurality of first lower conductive patterns selected from among the plurality of lower conductive patterns;
   a through electrode penetrating one of the memory cell insulation and the peripheral circuit board and extended to a second lower conductive pattern selected from among the plurality of lower conductive patterns in the vertical direction, in a second region, the second region overlapping the memory cell insulation in the vertical direction; and
   a conductive pad on the memory cell insulation in the second region.

2. The integrated circuit device of claim 1, wherein the through electrode penetrates the memory cell insulation and extends to the second lower conductive pattern.

3. The integrated circuit device of claim 1, wherein the through electrode penetrates the peripheral circuit board and the peripheral circuit region and extends to the second lower conductive pattern.

4. The integrated circuit device of claim 1, wherein the first lower conductive pattern and the second lower conductive pattern are at different levels.

5. The integrated circuit device of claim 1, wherein the first lower conductive pattern and the second lower conductive pattern are at the same level.

6. The integrated circuit device of claim 1, wherein the first lower conductive pattern and the second lower conductive pattern comprise different metals.

7. The integrated circuit device of claim 1, wherein the first lower conductive pattern and the second lower conductive pattern comprise the same metal.

8. The integrated circuit device of claim 1, wherein each of the first lower conductive pattern and the second lower conductive pattern has a shape in which a width in a horizontal direction increases as the first lower conductive pattern and the second lower conductive pattern respectively becomes closer toward the memory.

9. The integrated circuit device of claim 1, wherein the first lower conductive pattern has a shape in which a width in a horizontal direction increases as the first lower conductive pattern becomes closer toward the memory, and
   the second lower conductive pattern has a shape in which a width in the horizontal direction decreases as the second lower conductive pattern becomes closer toward the memory.

10. The integrated circuit device of claim 1, wherein the conductive pad is in contact with the through electrode and extends in a horizontal direction outside of the memory.

11. The integrated circuit device of claim 1,
   wherein the conductive pad is in contact with the through electrode and extending in a horizontal direction outside of the peripheral circuit, and the conductive pad is spaced apart from the peripheral circuit region with the peripheral circuit board therebetween.

12. An integrated circuit device comprising:
a memory comprising
a memory stack comprising
a plurality of bit lines extending in a first horizontal direction,
a memory cell interconnection comprising a plurality of upper conductive patterns configured to be electrically connectable to the plurality of bit lines, and
a memory cell insulation surrounding the memory stack and the memory cell interconnection;
a peripheral circuit comprising
a peripheral circuit board,
a peripheral circuit region on the peripheral circuit board, and
a peripheral circuit interconnection comprising a plurality of lower conductive patterns between the peripheral circuit region and the memory and bonded to the memory cell interconnection;
a conductive bonding on a boundary between the memory cell interconnection and the peripheral circuit interconnection in a first region, the first region overlapping the memory stack in a vertical direction, the conductive bonding being bonded first upper conductive pattern selected from among the plurality of upper conductive patterns and a first lower conductive pattern selected from among the plurality of lower conductive patterns; and
a plurality of through electrodes extended in the vertical direction through one of the memory cell insulation and the peripheral circuit board, in a second region spaced apart from the first region in a horizontal direction; and
a conductive pad on the memory cell insulation in the second region,
wherein the plurality of through electrodes comprise a plurality of first through electrodes arranged in a line along the first horizontal direction in the second region.

13. The integrated circuit device of claim 12, wherein the plurality of through electrodes further comprise a plurality of second through electrodes arranged in a line along a second horizontal direction perpendicular to the first horizontal direction in the second region.

14. The integrated circuit device of claim 12, wherein the plurality of through electrodes comprise one through electrode in contact with a second lower conductive pattern selected from among the plurality of lower conductive patterns, and
the one through electrode extends to the second lower conductive pattern through the memory cell insulation.

15. The integrated circuit device of claim 12, wherein the plurality of through electrodes comprise one through electrode in contact with a second lower conductive pattern selected from among the plurality of lower conductive patterns, and
the one through electrode extends to the second lower conductive pattern through the peripheral circuit board and the peripheral circuit region.

16. The integrated circuit device of claim 15, wherein a first shortest distance from the peripheral circuit board to the first lower conductive pattern is greater than a second shortest distance from the peripheral circuit board to the second lower conductive pattern.

17. The integrated circuit device of claim 15, wherein a first shortest distance from the peripheral circuit board to the first lower conductive pattern is the same as a second shortest distance from the peripheral circuit board to the second lower conductive pattern.

18. The integrated circuit device of claim 15, wherein the first lower conductive pattern and the second lower conductive pattern comprise different metals.

19. An integrated circuit device comprising:
a memory structure including a first metal pad, the memory structure comprising:
a semiconductor layer,
a memory stack on the semiconductor layer,
a memory cell interconnection comprising a plurality of upper conductive patterns overlapping the memory stack in a vertical direction and configured to be electrically connectable to the memory stack, and
a memory cell insulation surrounding the semiconductor layer, the memory stack, and the memory cell interconnection;
a peripheral circuit structure including a second metal pad and vertically connected to the memory structure by the first metal pad and the second metal pad, the peripheral circuit structure comprising:
a peripheral circuit board,
a peripheral circuit region on the peripheral circuit board, and
a peripheral circuit interconnection between the peripheral circuit region and the memory and bonded to the memory cell interconnection;
a plurality of conductive bonding structures comprising Cu and on a boundary between the memory cell interconnection and the peripheral circuit interconnection in a first region, the first region overlapping the memory stack in the vertical direction, the plurality of conductive bonding structures including the first metal pad and the second metal pad;
a plurality of lower conductive patterns comprising at least one metal selected from among Al, W, and Cu and in the peripheral circuit interconnection in a second region, the second region overlapping the memory cell insulation in the vertical direction; and
a through electrode penetrating one of the memory cell insulation and the peripheral circuit board in the second region and contacting one lower conductive pattern among the plurality of lower conductive patterns.

20. The integrated circuit device of claim 19, wherein the plurality of lower conductive patterns comprise a first lower conductive pattern constituting the plurality of conductive bonding structures and a second lower conductive pattern in contact with the through electrode,
the first lower conductive pattern has a shape in which a width in a horizontal direction increases as the first lower conductive pattern becomes closer toward the memory structure, and
the second lower conductive pattern has a shape in which a width in the horizontal direction decreases as the second lower conductive pattern becomes closer toward the memory structure.

* * * * *